(12) United States Patent
Haji

(10) Patent No.: US 7,222,774 B2
(45) Date of Patent: May 29, 2007

(54) ELECTRONIC COMPONENT MOUNTING APPARATUS AND ELECTRONIC COMPONENT MOUNTING METHOD

(75) Inventor: Hiroshi Haji, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/356,846

(22) Filed: Feb. 17, 2006

(65) Prior Publication Data

US 2006/0201999 A1 Sep. 14, 2006

Related U.S. Application Data

(62) Division of application No. 10/774,239, filed on Feb. 6, 2004, now Pat. No. 7,025,244.

(30) Foreign Application Priority Data

| Feb. 10, 2003 | (JP) | ............................. 2003-032151 |
| Mar. 7, 2003 | (JP) | ............................. 2003-062247 |
| Mar. 7, 2003 | (JP) | ............................. 2003-062248 |

(51) Int. Cl.
*B23K 20/12* (2006.01)
(52) U.S. Cl. ...................... 228/112.1; 228/2.1; 228/219
(58) Field of Classification Search ................ 228/9, 228/49.5, 102, 112.1, 2.1, 119
See application file for complete search history.

(56) References Cited

U.S. PATENT DOCUMENTS

| 5,456,003 A | * | 10/1995 | Yamamoto et al. ............ 29/840 |
| 5,457,538 A | | 10/1995 | Ujiie |
| 5,519,535 A | | 5/1996 | Mok ........................... 359/629 |
| 5,850,252 A | | 12/1998 | Miyata ......................... 348/87 |
| 5,864,944 A | | 2/1999 | Kashiwagi et al. |
| 5,884,831 A | | 3/1999 | Sato et al. |
| 5,903,662 A | | 5/1999 | DeCarlo ...................... 382/151 |
| 5,943,089 A | | 8/1999 | Douglas ....................... 348/87 |
| 6,781,775 B2 | | 8/2004 | Bendat et al. .............. 359/834 |
| 6,943,423 B2 | * | 9/2005 | Kim ........................... 257/433 |

FOREIGN PATENT DOCUMENTS

| DE | 100 12 043 | 10/2001 |
| JP | 10-22347 | 1/1998 |

(Continued)

*Primary Examiner*—Jonathan Johnson
(74) *Attorney, Agent, or Firm*—Pearne & Gordon LLP

(57) ABSTRACT

In an electronic component mounting method in which electronic components are sucked/held by plural respective nozzles provided on a mounting head so as to be mounted on electronic component mounting portions of a board, such a mounting operation is sequentially carried out as to all of the electronic components, in which the electronic components are sucked/held by the plural nozzles; an electronic component sucked/held by one of the plural nozzles is provisionally positioned above one electronic component mounting portion; both this electronic component and the electronic component mounting portion are observed by an observation head which is located between the board and the mounting head; a relative position detecting operation for detecting a relative positional relationship between this electronic component and the electronic component mounting portion is carried out as to all of the electronic components held by the mounting head; and the electronic component is positioned with respect to the electronic component mounting portion so as to be mounted thereon while the detected relative positional relationship is reflected.

21 Claims, 25 Drawing Sheets

FOREIGN PATENT DOCUMENTS

| | | |
|---|---|---|
| JP | 2000-323895 | 11/2000 |
| JP | 2001-77592 | 3/2001 |
| JP | 2001-177298 | 6/2001 |
| JP | 2002-118153 | 4/2002 |
| JP | 2002-313844 | 10/2002 |
| JP | 2003-23296 | 1/2003 |
| JP | 2003-60397 | 2/2003 |
| JP | 2004039802 * | 2/2004 |

* cited by examiner

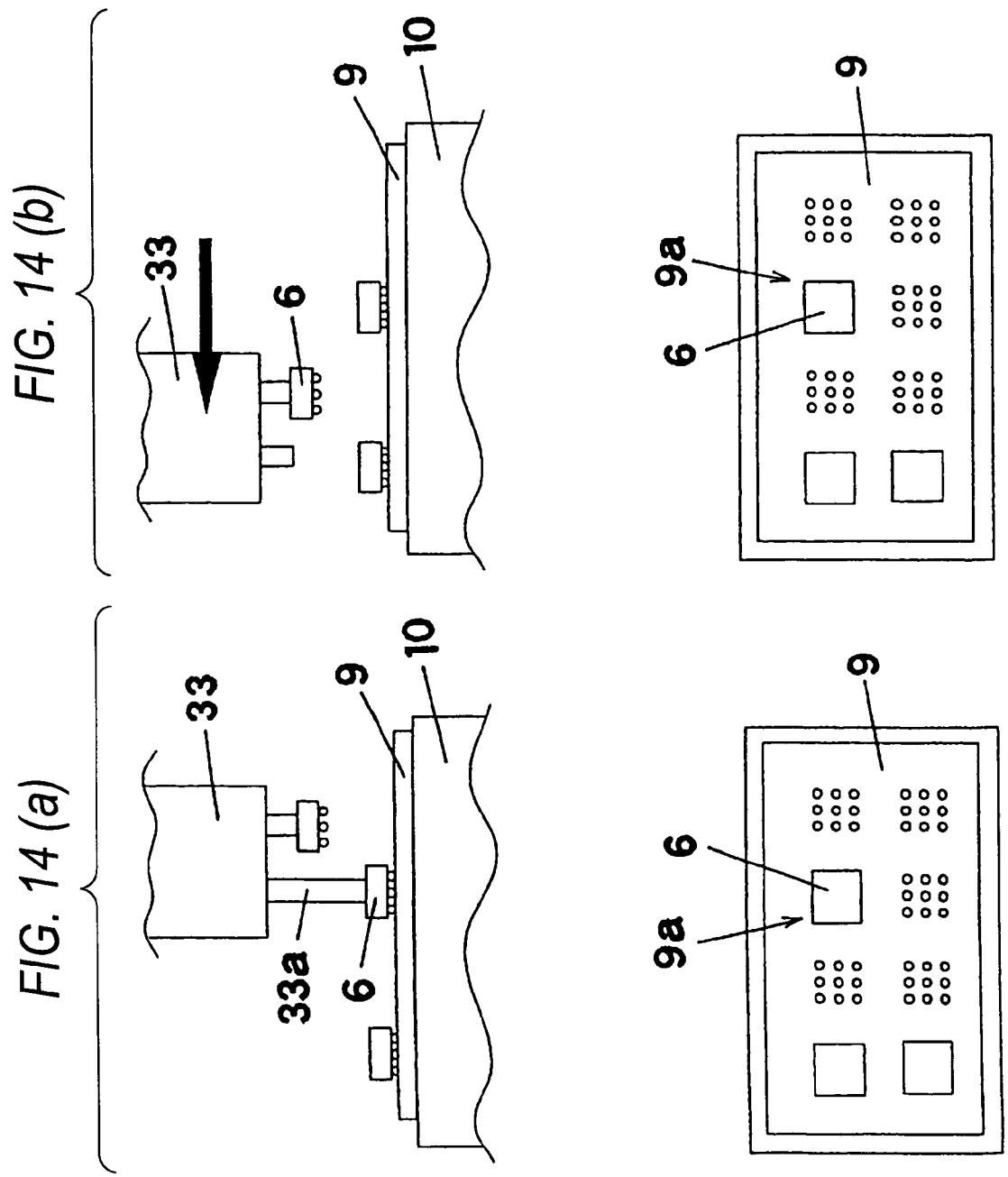

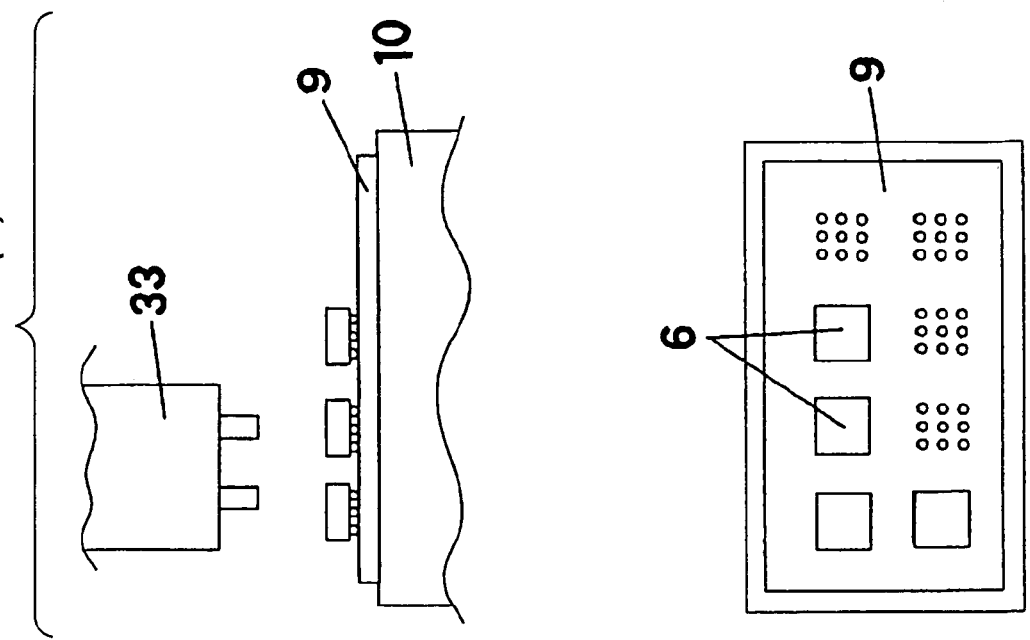
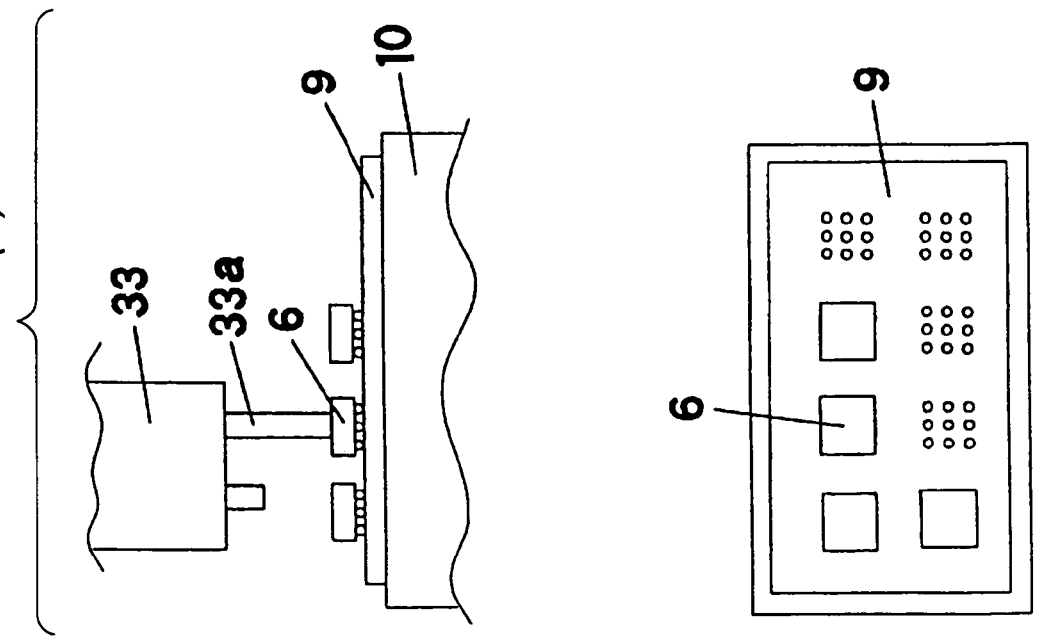

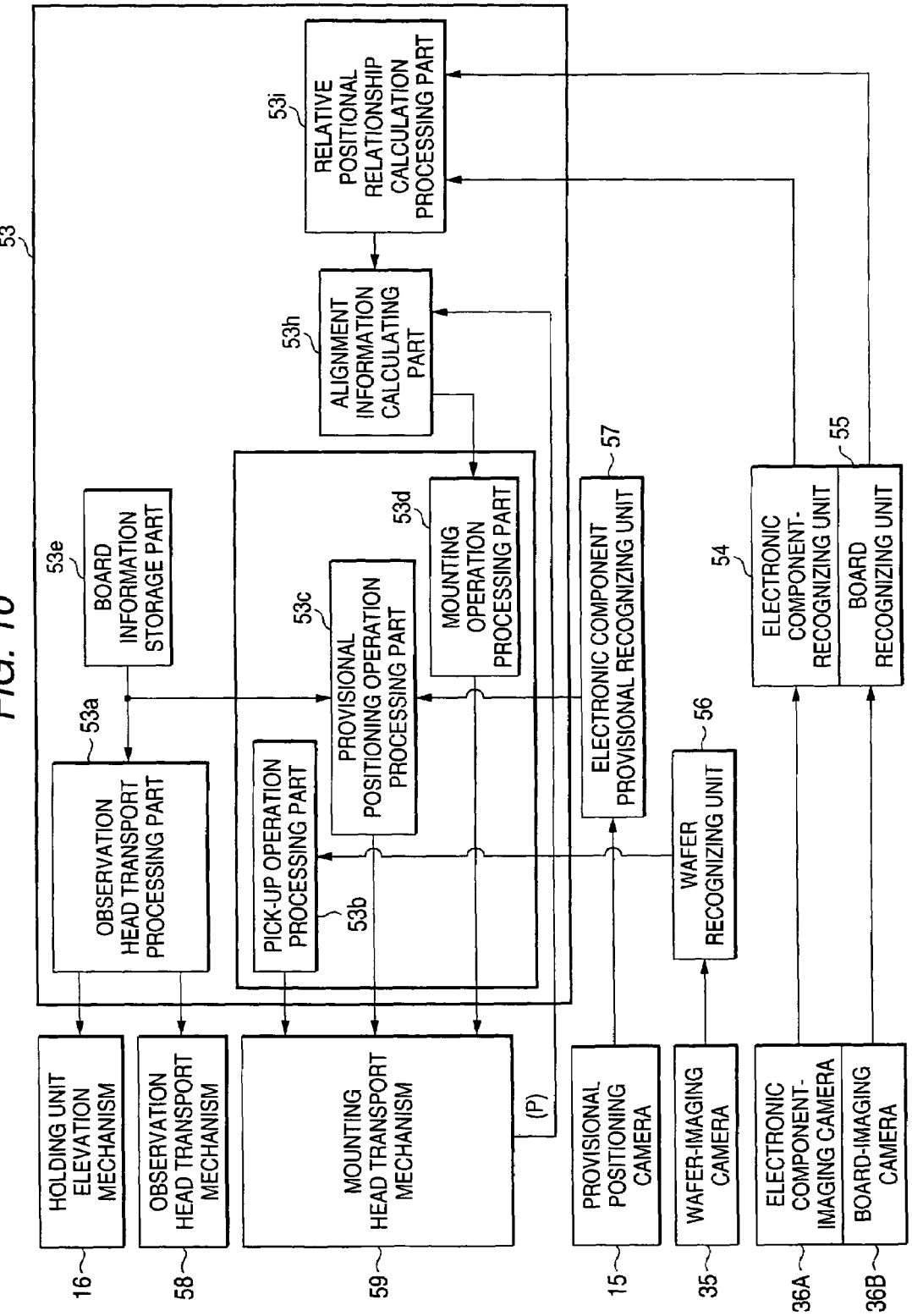

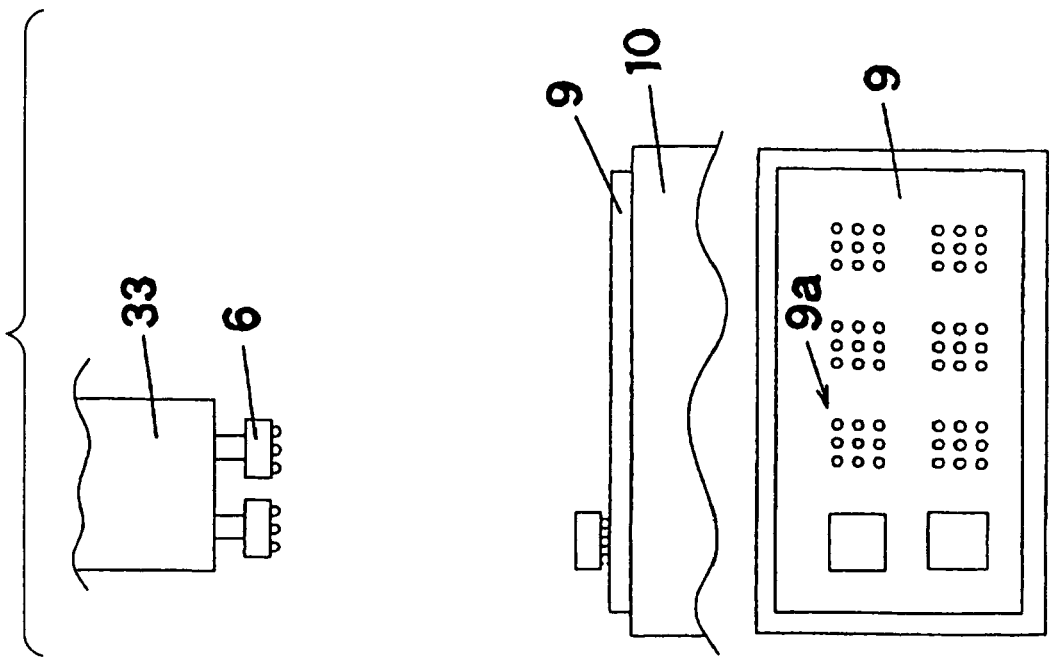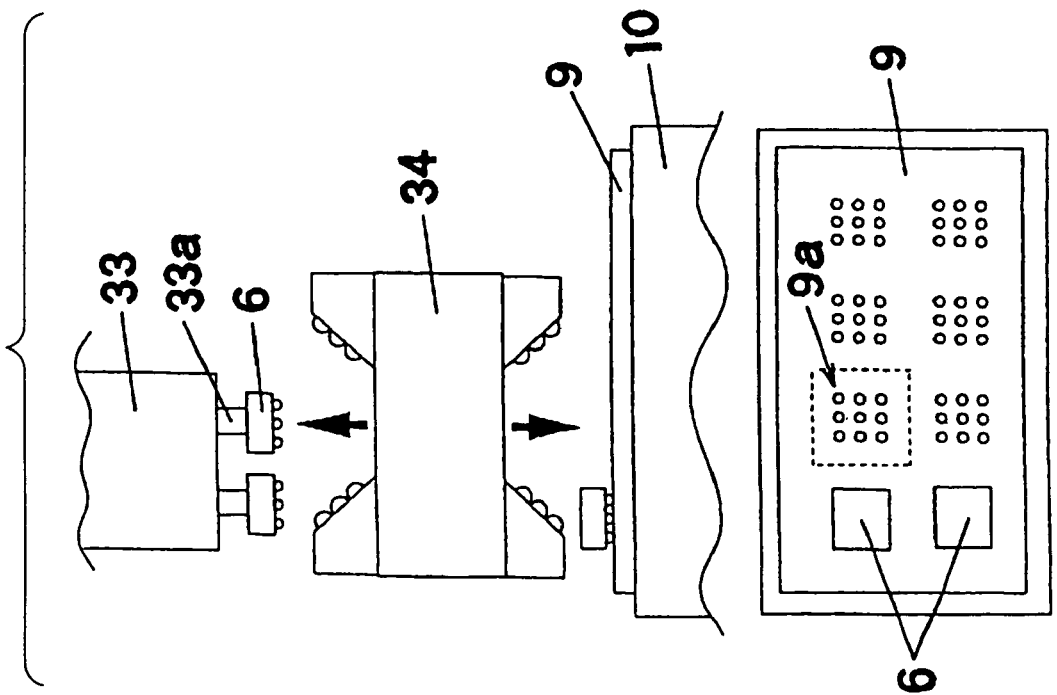

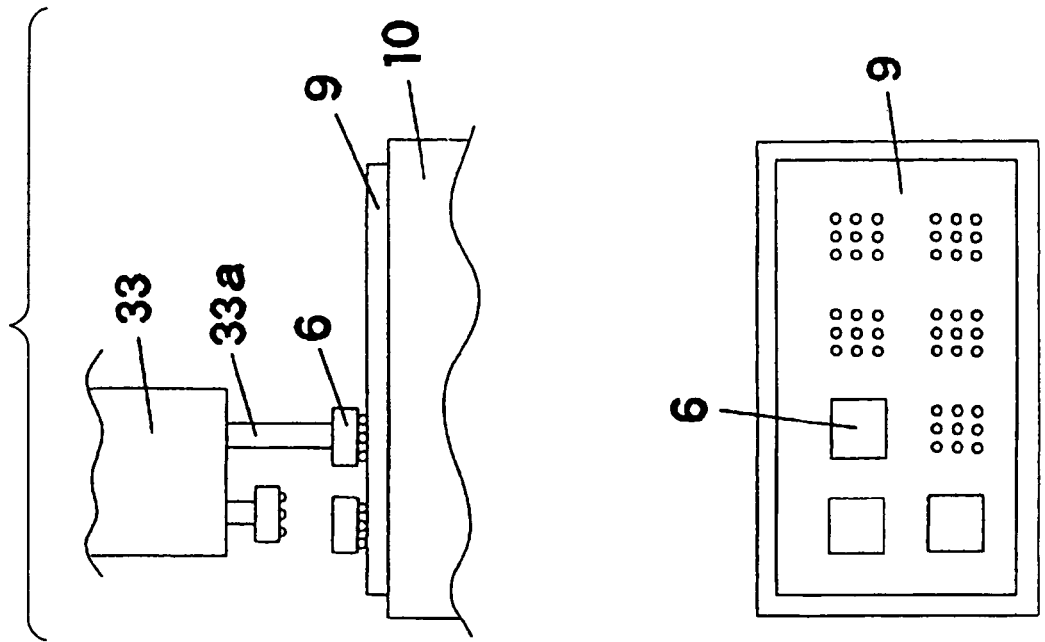
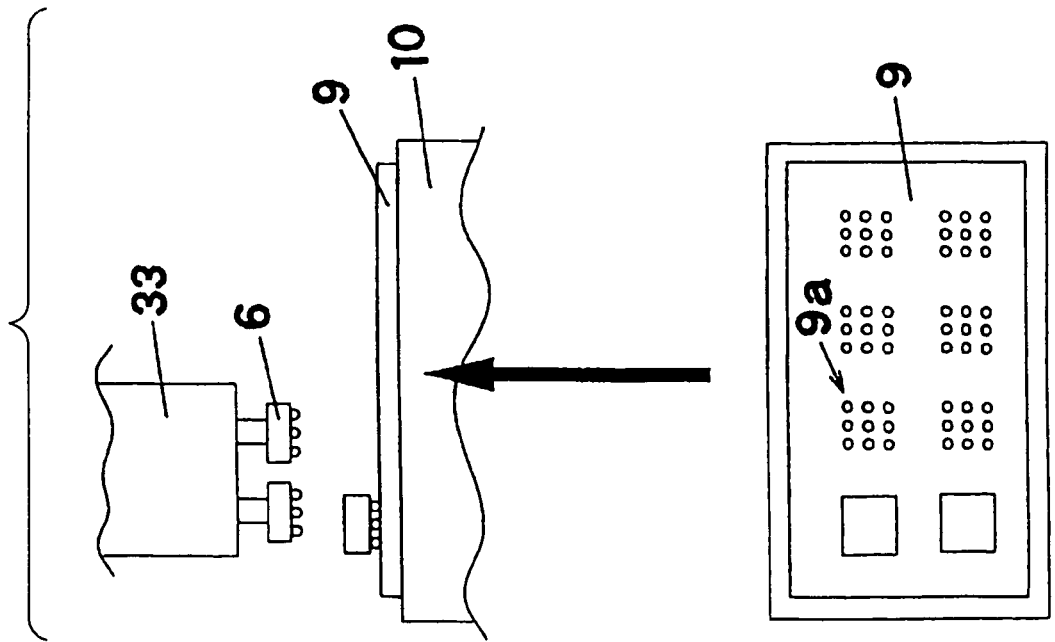

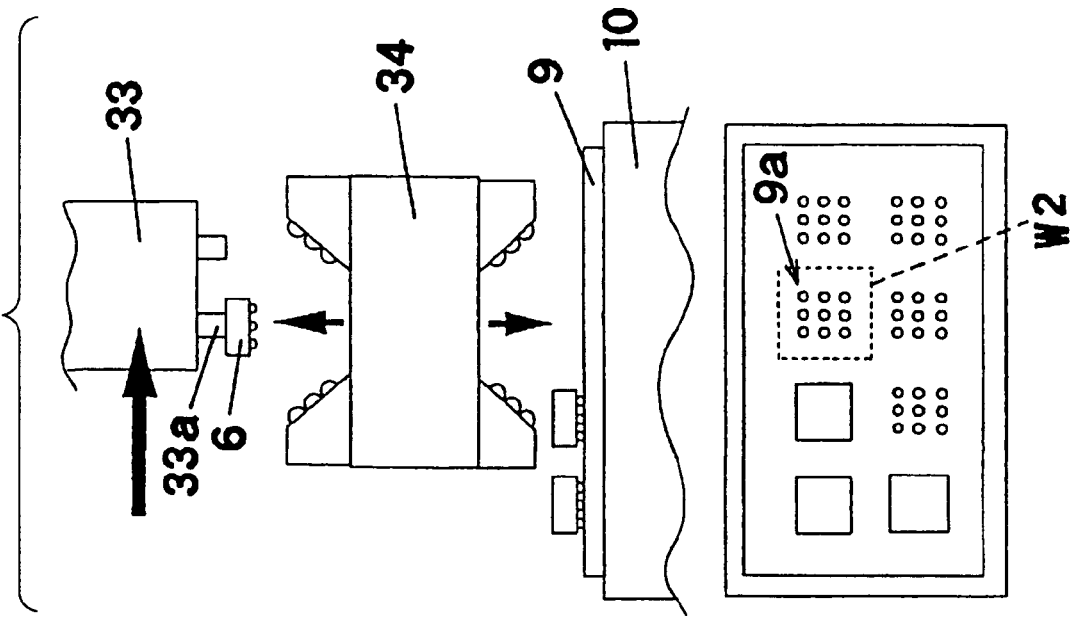
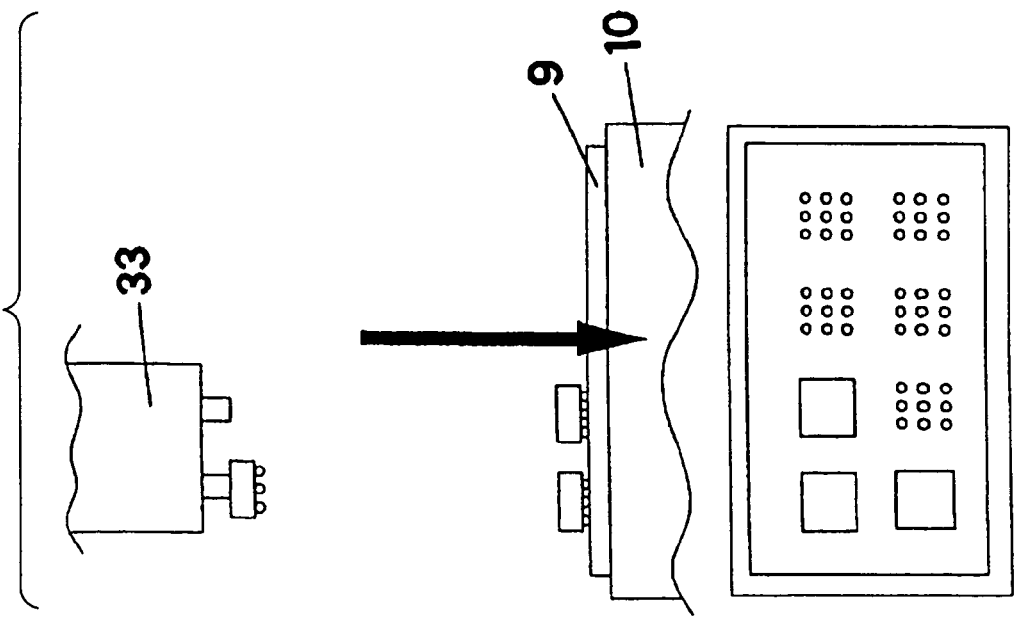

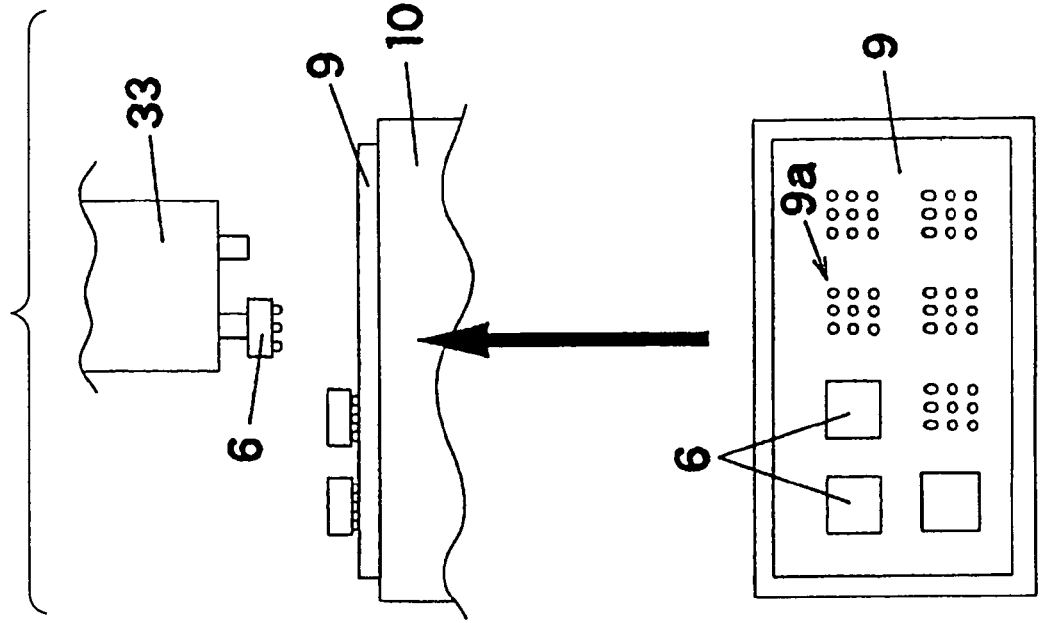
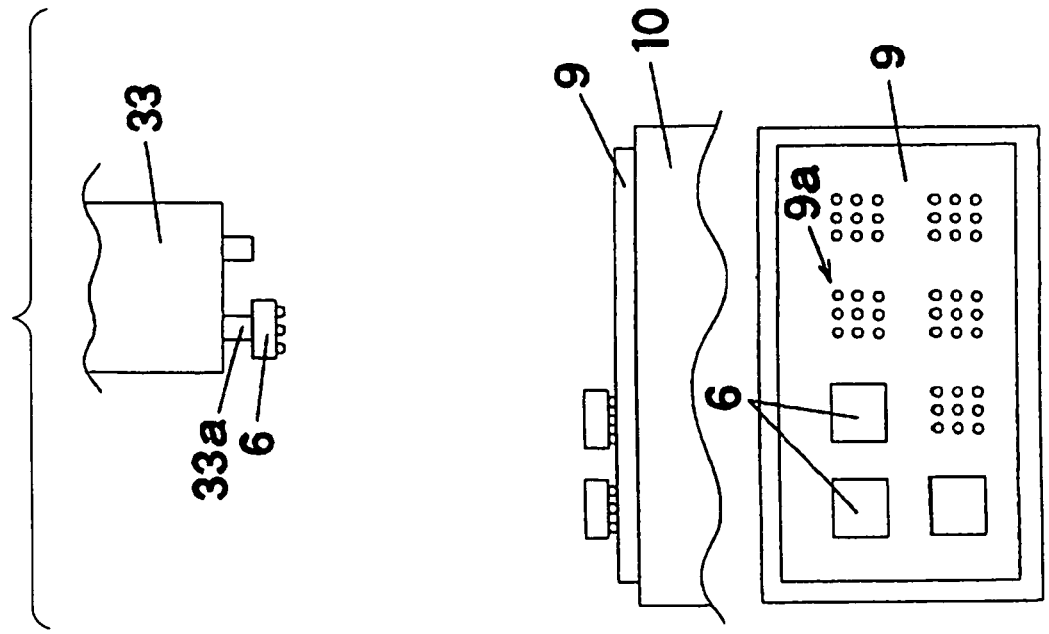

ELECTRONIC COMPONENT MOUNTING APPARATUS AND ELECTRONIC COMPONENT MOUNTING METHOD

BACKGROUND OF THE INVENTION

The present invention is related to an electronic component mounting apparatus and an electronic component mounting method, which mount an electronic component on a board.

In electronic component mounting apparatus, mounting operations are repeatedly carried out in which electronic components derived from electronic component supply units are held by mounting heads and then are mounted on boards. In these mounting operations, since the electronic components are required to be positioned on the boards in higher precision, such positioning methods have been widely employed. In the positioning methods, while both the electronic components being held by the mounting heads and positions of mounting points on the boards are optically detected, the electronic components and the boards are relatively positioned with each other based upon position detecting results.

In such an optical position detecting operation, two images acquired by photographing an electronic component and a board by a camera are processed by way of an image recognizing process operation so as to execute this optical position detecting operation. In this image recognizing process operation, since both the electronic component and the mounting position of the board are recognized based upon different images, in order that the electronic component is positioned with respect to the mounting point of the board in higher precision, it is very important to correctly acquire a relative positional relationship between these two images with respect to an optical coordinate system.

To this end, such a camera of upper/lower visual-field directions has been employed (for example, see Japanese Laid-open Patent Application No. 2001-77592). In this camera, both a board recognizing camera whose photographing visual-field direction is downwardly directed and an electronic component recognizing camera whose photographing visual-field direction is upwardly directed are constructed in an integral form. When this camera is used, generally speaking, under such a condition that a mounting head which holds an electronic component is positioned over a board, this camera is advanced to a space formed between the mounting head and the board, and then simultaneously acquires both an image as to a mounting point of the board and an image as to the electronic component held by the mounting head. As a result, a relative positional relationship between a photographing visual field along the upper direction and a photographing visual field along the lower direction is continuously maintained, so that high-precision position detecting operations may be realized.

However, in the above-described prior art, since there is such a restriction that the camera must be positioned between the board and the mounting head, a limitation is made in shortening of tact time of the mounting operation. In other words, since the above-described position detecting operation is carried out with respect to each of the electronic components mounted by the mounting head, in a mounting operation of one electronic component, both an operation for advancing the camera just under the mounting head so as to acquire images, and another operation for evacuating the camera from the space over the board in order to avoid interference occurred between the camera and the descending operation of the mounting head after the images have been acquired are required to be carried out every time the above-described mounting operation of one electronic component is performed.

Also, when the mounting head which has held the electronic component performs the mounting operation over the board, an elevation height of the mounting head must be set to a low value as being permitted as possible in order that the operation time thereof may be desirably shortened. However, as previously explained, since such a clearance by which the camera can be advanced must be secured, the descent amount of the mounting head required in the mounting operation cannot be decreased. As previously explained, in the conventional electronic component mounting apparatus, the superior mounting position precision can be hardly compatible with the electronic component mounting work executed in the high efficiency.

SUMMARY OF THE INVENTION

Under such a circumstance, an object of the present invention is to provide an electronic component mounting apparatus and an electronic component mounting method, capable of realizing that superior mounting position precision is compatible with an electronic component mounting work executed in a high efficiency.

An electronic component mounting apparatus, according to the present invention, is featured by comprising: a holding unit for holding a board; a mounting head equipped with a plurality of mounting nozzles for sucking/holding electronic components and having a mounting nozzle elevation mechanism for separately elevating the plural mounting nozzles; electronic component supplying means for supplying the electronic components to the mounting head; a mounting head transport mechanism for transporting the mounting head between the holding unit and the electronic component supplying means; an observation head for acquiring both an image of a provisionally positioned electronic component and an image of an electronic component mounting portion from a space defined between the electronic component mounting portion and the provisionally positioned electronic component under such a condition that the electronic component sucked/held by the mounting nozzle has been provisionally positioned above a plurality of electronic component mounting portions formed on the board; an observation head transport mechanism for transporting the observation head in synchronism with the electronic components which are sequentially and provisionally positioned by moving the mounting head, and also for evacuating the observation head from an upper space of the holding unit when the electronic component is mounted on the board; and control means for controlling the mounting head transport mechanism based upon both the image of the electronic component and the image of the electronic component mounting portion, which have been acquired by the observation head, so as to sequentially position the electronic components sucked/held by the respective mounting nozzles with respect to the electronic component mounting portions corresponding thereto.

An electronic component mounting apparatus, according to the present invention, is featured by comprising: a provisionally positioning operation processing part for sequentially positioning the electronic components sucked/held by the plurality of mounting nozzles to an upper space of the electronic component mounting portions by controlling the mounting head transport mechanism; observing means equipped with an observation head for acquiring both an image of the provisionally positioned electronic component and an image of the electronic component mounting portion from a space defined between the provisionally positioned electronic component and the electronic component mounting portion every a set of the provisionally positioned electronic component and the electronic component mounting portion; a provisional-positioning positional information storage part for storing thereinto a position of the mounting head when a provisional positioning operation is carried out as provisional-positioning positional information every the set; a relative positional relationship calculating process part for calculating a relative positional relationship between the electronic component sucked/held by the mounting nozzle and the electronic component mounting portion every the set based upon both the image of the electronic component and the image of the electronic component mounting portion on which the electronic component is mounted, which have been acquired by the observation head; a relative positional relationship storage part for storing thereinto the relative positional relationship calculated by the relative positional relationship calculating process part every the set; an alignment information calculating part for calculating alignment information used to position the mounting head based upon both the provisional-positioning positional information and the relative positional relationship every the set, which have been stored into the provisional-positioning positional information storage part and the relative positional relationship storage part, respectively; and a mounting operation processing part for controlling the mounting head transport mechanism based upon the alignment information so as to sequentially position the electronic components sucked/held by the respective mounting nozzles with respect to the corresponding electronic component mounting portions and to mount the positioned electronic components on the corresponding electronic component mounting portions.

An electronic component mounting apparatus, according to the present invention, is featured by comprising: a provisionally positioning operation processing part for sequentially positioning the electronic components sucked/held by the plurality of mounting nozzles to an upper space of the electronic component mounting portions by controlling the mounting head transport mechanism; observing means equipped with an observation head for acquiring both an image of the provisionally positioned electronic component and an image of the electronic component mounting portion from a space defined between the provisionally positioned electronic component and the electronic component mounting portion every a set of the provisionally positioned electronic component and the electronic component mounting portion; a relative positional relationship calculating process part for calculating a relative positional relationship between the electronic component sucked/held by the mounting nozzle and the electronic component mounting portion every the set based upon both the image of the electronic component and the image of the electronic component mounting portion on which the electronic component is mounted, which have been acquired by the observation head; an alignment information calculating part for calculating alignment information used to position the mounting head based upon both a position of the mounting head when the provisional positioning operation is carried out and the relative positional information; an alignment information storage part for storing thereinto the alignment information calculated by the alignment information calculating part every the set; and a mounting operation processing part for controlling the mounting head transport mechanism based upon the alignment information so as to sequentially position the electronic components sucked/held by the respective mounting nozzles with respect to the corresponding electronic component mounting portions and to mount the positioned electronic components on the corresponding electronic component mounting portions.

An electronic component mounting method, according to the present invention, is featured by such an electronic component mounting method in which an electronic component is sucked/held by each of a plurality of mounting nozzles provided in a mounting head so as to be mounted on an electronic component mounting portion of a board, comprising: a component holding step for sucking/holding electronic components by the plurality of mounting nozzles of the mounting head; a provisional positioning step for provisionally positioning the electronic component sucked/held by one of the plural mounting nozzles above one electronic component mounting portion; an observing step in which both an image of the provisionally positioned electronic component and an image of the electronic component mounting portion are acquired by an observation head located in a space defined between the provisionally positioned electronic component and the electronic component mounting portion; a relative positional relationship detecting step for detecting a relative positional relationship between the provisionally positioned electronic component and the electronic component mounting portion based upon the images of both the electronic component and the electronic component mounting portion, which are acquired in the observing step; a step for sequentially executing the provisional positioning step, the observing step, and the relative positional relationship detecting step as to all of the electronic components sucked/held by other mounting nozzles; an observation head evacuating step for evacuating the observation head from an upper space of the board; and also, a step in which such a mounting operation that the electronic components sucked/held by the plurality of mounting nozzles are positioned so as to be mounted on the electronic component mounting portions by transporting the mounting head while reflecting thereto the relative positional relationship detected in the relative positional relationship detecting step is carried out with respect to all of the electronic components.

An electronic component mounting method, according to the present invention, is featured by comprising: a component holding step for sucking/holding electronic components by the plurality of mounting nozzles of the mounting head; a provisional positioning step for provisionally positioning the electronic component sucked/held by one of the plural mounting nozzles above one electronic component mounting portion; an observing step in which one set of both an image of the provisionally positioned electronic component and an image of the electronic component mounting portion are acquired by an observation head located in a space defined between the provisionally positioned electronic component and the electronic component mounting portion; a relative positional relationship detecting step for detecting a relative positional relationship between the provisionally positioned electronic component and the electronic component mounting portion based upon the images of both the electronic component and the electronic component mounting portion, which are acquired in the observing step; a storage step for storing thereinto the relative positional relationship and provisional positioning positional information corresponding to positional information of the provisionally positioned mounting head; a step in which since the provisional positioning step, the observing step, the relative positional relationship detecting step, and the storage step are sequentially executed every a set of both all of the electronic components sucked/held by other mounting nozzles and the electronic component mounting portions on which the electronic components are mounted, both the provisional positioning positional information and the relative positional relationship are stored every the set; an observation head evacuating step for evacuating the observation head from an upper space of the board; and a step in which alignment information is calculated every the set based upon the stored provisional positioning positional information and the stored relative positional information, and then, such a mounting operation is executed every the set, in which the electronic components are positioned so as to be mounted with respect to the electronic component mounting portions by transporting the mounting head based upon the alignment information.

An electronic component mounting method, according to the present invention, is featured by comprising: a component holding step for sucking/holding electronic components by the plurality of mounting nozzles of the mounting head; a provisional positioning step for provisionally positioning the electronic component sucked/held by one of the plural mounting nozzles above one electronic component mounting portion; an observing step in which one set of both an image of the provisionally positioned electronic component and an image of the electronic component mounting portion are acquired by an observation head located in a space defined between the provisionally positioned electronic component and the electronic component mounting portion; a relative positional relationship detecting step for detecting a relative positional relationship between the provisionally positioned electronic component and the electronic component mounting portion based upon the images of both the electronic component and the electronic component mounting portion, which are acquired in the observing step; an alignment information calculating step for calculating alignment information based upon both the relative positional relationship and provisional positioning positional information corresponding to positional information of the provisionally positioned mounting head; a storage step for storing thereinto the calculated alignment information; a step in which since the provisional positioning step, the observing step, the relative positional relationship detecting step, the alignment information calculating step, and the storage step are sequentially executed every a set of both all of the electronic components sucked/held by other mounting nozzles and the electronic component mounting portions on which the electronic components are mounted, alignment information is stored every the set; an observation head evacuating step for evacuating the observation head from an upper space of the board; and a step in which such a mounting operation is executed every the set, in which the electronic components are positioned so as to be mounted with respect to the electronic component mounting portions by transporting the mounting head based upon the stored alignment information.

In accordance with the present invention, in such an electronic component mounting operation that the electronic components are sucked/held by the respective plurality nozzles provided on the mounting head and are mounted on the electronic component mounting portions of the board 9, such a relative position detecting operation is carried out with respect to all of the electronic components which have been sucked/held by the nozzles, while in this relative position detecting operation, both the provisionally positioned electronic component and the electronic component mounting portion are observed by the observation head which is located in the space defined between this electronic component and the electronic component mounting portion. Then, the mounting operation for positioning the electronic component with respect to the electronic component mounting portion by reflecting the calculated relative positional relationship so as to mount this positioned electronic component thereon is sequentially carried out with respect to all of the electronic components. As a consequence, the better mounting positional precision can be compatible with the high-efficiency component mounting work.

BRIEF DESCRIPTION OF THE DRAWINGS

FIGS. 14(a) and 14(b) are step explanatory diagrams for explaining the electronic component mounting method (standard mode) of the embodiment 1 of the present invention.

FIGS. 15(a) and 15(b) are step explanatory diagrams for explaining the electronic component mounting method (standard mode) of the embodiment 1 of the present invention.

FIG. 16 is a functional block diagram for indicating processing functions in the case that the electronic component mounting apparatus according to the embodiment 1 of the present invention is operated in a high precision mode.

FIGS. 18(a) and 18(b) are step explanatory diagrams for explaining the electronic component mounting method (high precision mode) of the embodiment 1 of the present invention.

FIGS. 19(a) and 19(b) are step explanatory diagrams for explaining the electronic component mounting method (high precision mode) of the embodiment 1 of the present invention.

FIGS. 20(a) and 20(b) are step explanatory diagrams for explaining the electronic component mounting method (high precision mode) of the embodiment 1 of the present invention.

FIGS. 21(a) and 21(b) are step explanatory diagrams for explaining the electronic component mounting method (high precision mode) of the embodiment 1 of the present invention.

DETAILED DESCRIPTION OF THE PREFERRED EMBODIMENTS (Embodiment 1)

In the patent specification of the present invention, it is so considered that a carrier member (carrier jig) to which a plurality of piece boards have been set is also a "board". In this case, it is so assumed that a mounting unit of an electronic component, which has been formed on a piece board set to the carrier member corresponds to "electronic component mounting portion which has been formed on board".

Figure 1:
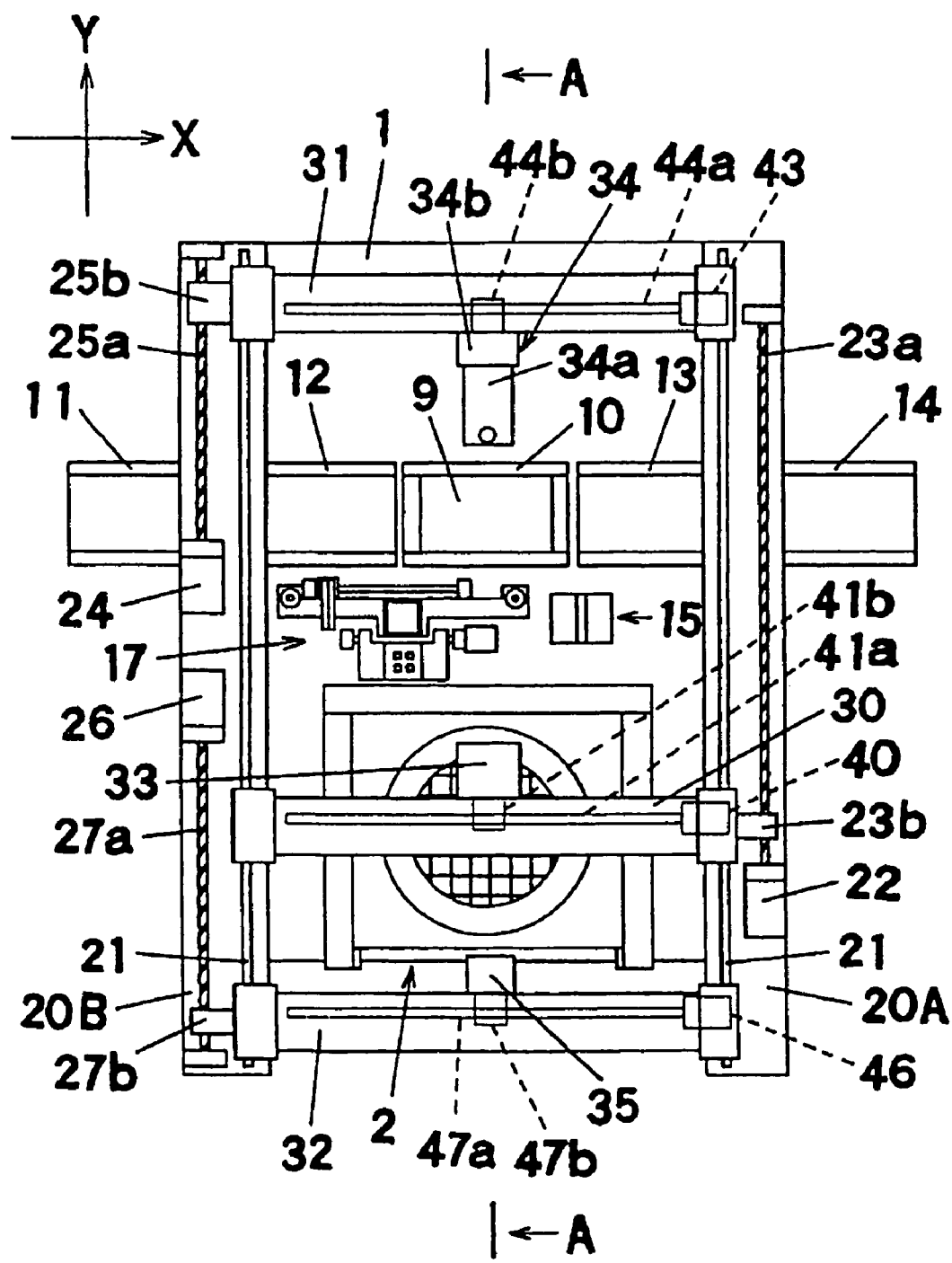
FIG. 1 is a plan view of an electronic component mounting apparatus according to an embodiment 1 of the present invention.
Figure 2:
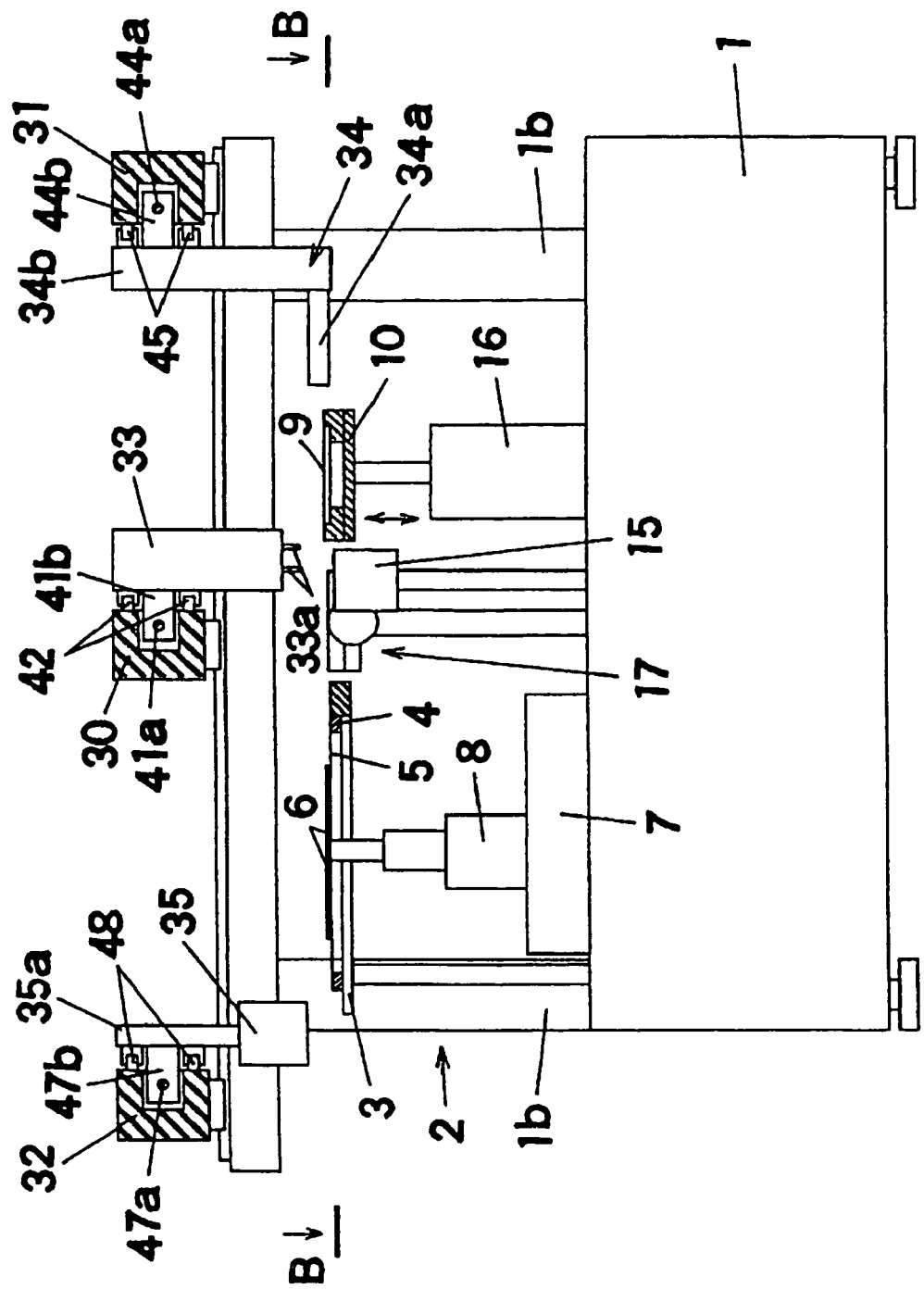
FIG. 2 is a side sectional view of the electronic component mounting apparatus of the embodiment 1 of the present invention.
Figure 3:
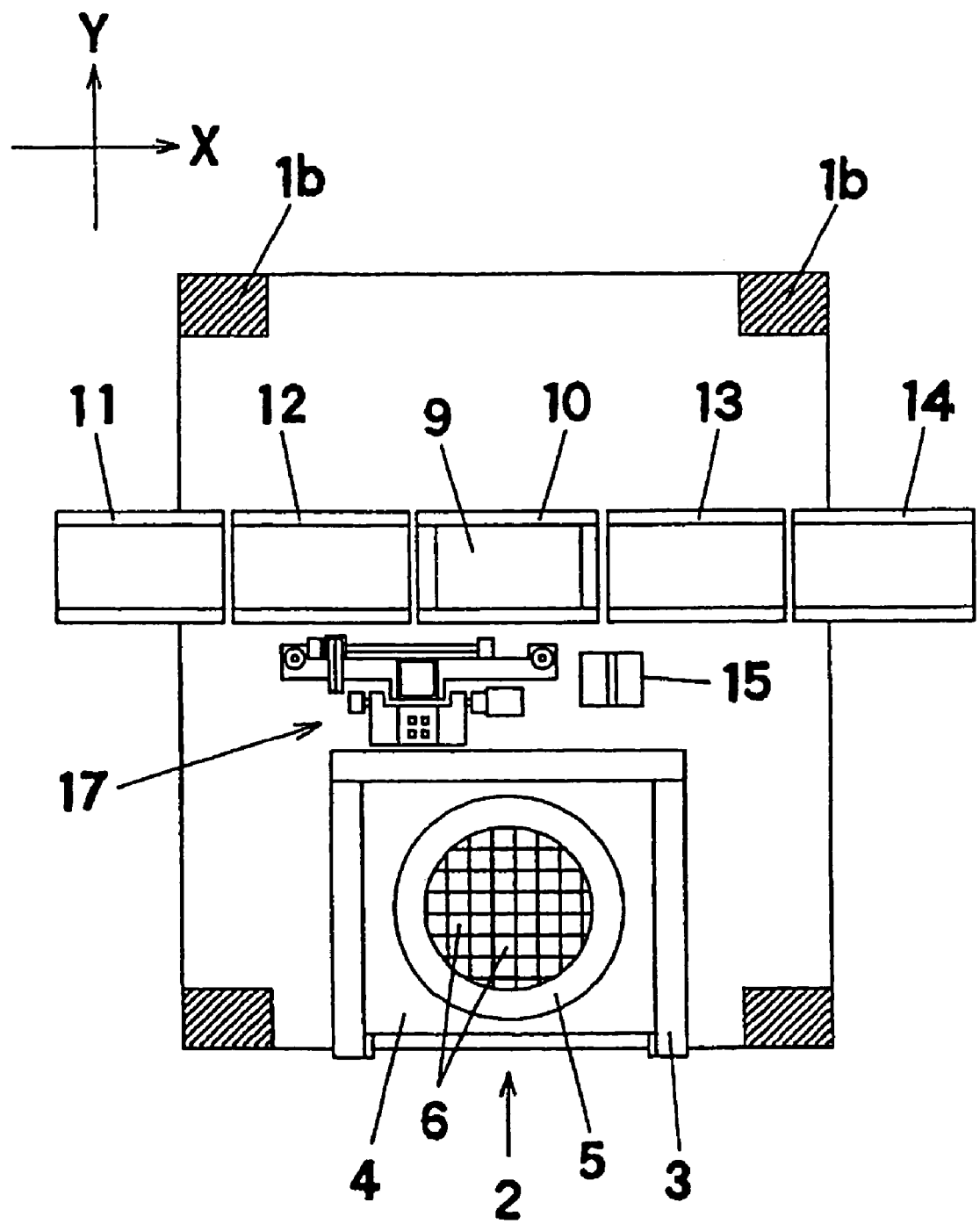
FIG. 3 is a plan sectional view of the electronic component mounting apparatus of the embodiment 1 of the present invention.

First, an entire structure of an electronic component mounting apparatus will now be explained with reference to FIG. 1, FIG. 2, and FIG. 3. FIG. 2 is a sectional view for showing the electronic component mounting apparatus, taken along an arrow "A—A" of FIG. 1. FIG. 3 is another sectional view for indicating the electronic component mounting apparatus, taken along an arrow "B—B" of FIG. 2. In FIG. 1, an electronic component supplying unit 2 is arranged on a base 1. As shown in FIG. 2 and FIG. 3, the electronic component supplying unit 2 is equipped with a jig holder 3, and this jig holder 3 detachably holds thereon a jig 4 on which an adhesive seat 5 has been mounted.

Semiconductor chips 6 (will be simply abbreviated as "chips 6" hereinafter) corresponding to an electronic component are adhered on the adhesive seat 5 under such a condition that these semiconductor chips are individually separated. A plurality of bumps 6a (see FIG. 8(a)) corresponding to projected electrodes are formed on an upper plane of the chips 6. Under such a condition that the jig 4 is held by the jig holder 3, the electronic component supplying unit 2 supplies a plurality of chips 6 under such a condition that bump formed planes thereof are directed to an upper direction.

As indicated in FIG. 2, an ejector 8 is arranged under the adhesive seat 5 held by the jig holder 3 in such a manner that the ejector 8 can be moved along a horizontal direction by an ejector XY table 7. The ejector 8 is equipped with a pin elevation mechanism which elevates a raising ejector pin (not shown). When the chip 6 is picked up from the adhesive seat 5 by a mounting head (will be discussed later), the chip 6 is raised by the ejector pin 6 from a lower direction of the adhesive seat 5, so that the chip 6 exfoliates from the adhesive seat 5. The ejector 8 constitutes an adhesive seat exfoliation mechanism for exfoliating the chip 6 from the adhesive seat 5.

As shown in FIG. 3, a holding unit 10 is arranged at a position separated from the electronic component supply unit 2 on the upper plane of the base 1 along a Y direction (namely, first direction). Board carry-in conveyers 11 and 12 are arrayed in a series manner on the upper stream side of the holding unit 10 along an X direction (namely, second direction), whereas board carry-out conveyers 13 and 14 are arrayed in a series manner on the lower stream side of the holding unit 10 along the X direction. The board carry-in conveyers 11 and 12 receive the board 9 supplied from the upper stream side, and then pass the received board 9 to the holding unit 10. The holding unit 10 holds thereon the passed board 9 and positions this board 9 at a packaging position. The mounted board 9 is carried out to the down stream side.

Figure 12:
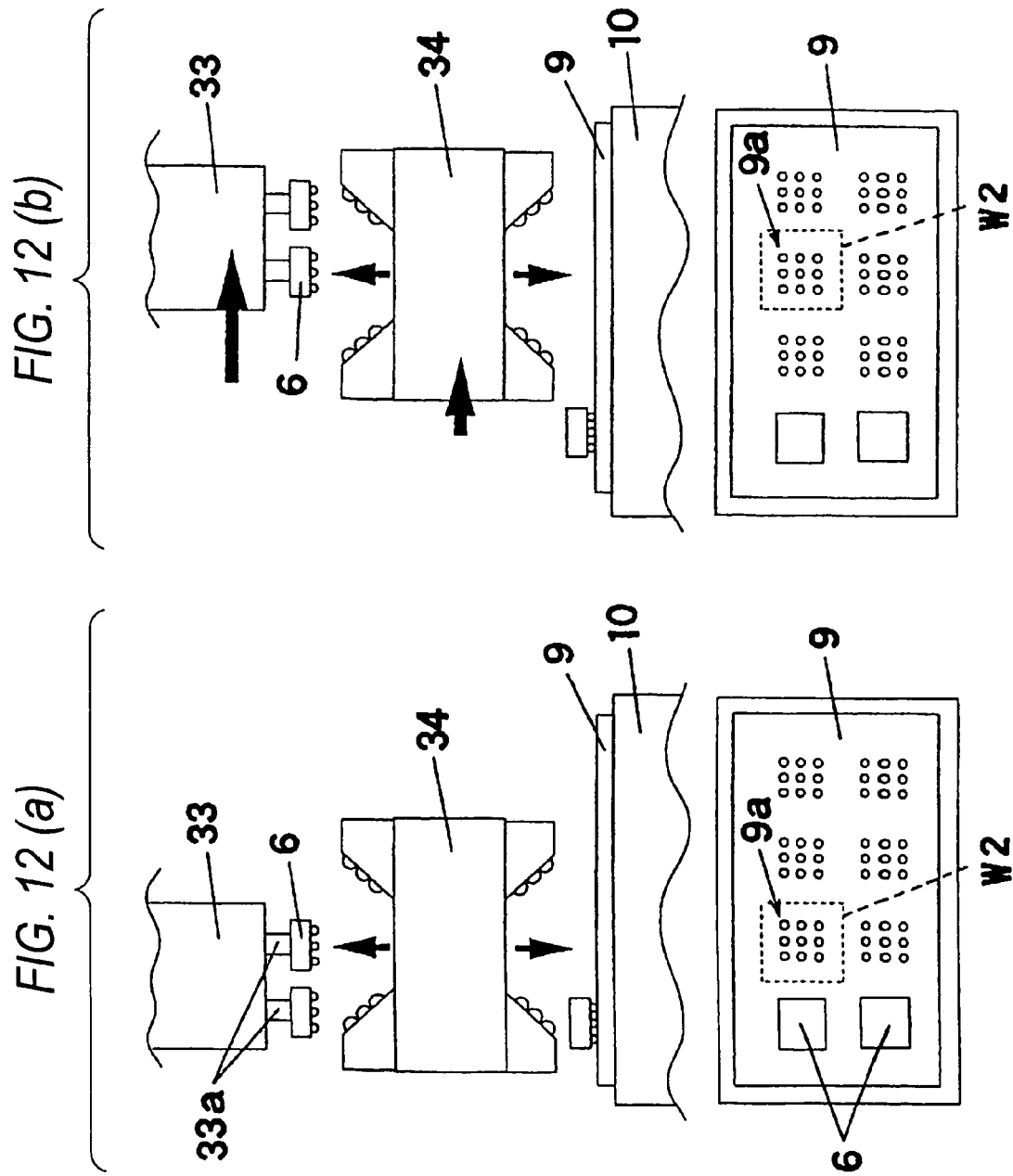
FIGS. 12(a) and 12(b) are step explanatory diagrams for explaining the electronic component mounting method (standard mode) of the embodiment 1 of the present invention.
Figure 13:
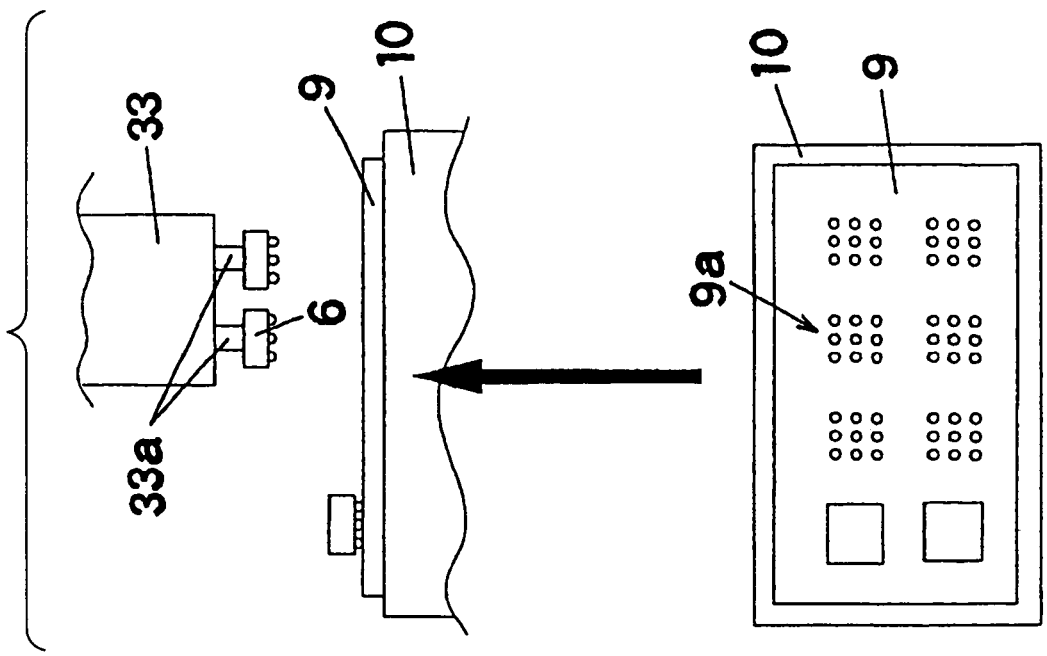
FIGS. 13(a) and 13(b) are step explanatory diagrams for explaining the electronic component mounting method (standard mode) of the embodiment 1 of the present invention.
Figure 13:
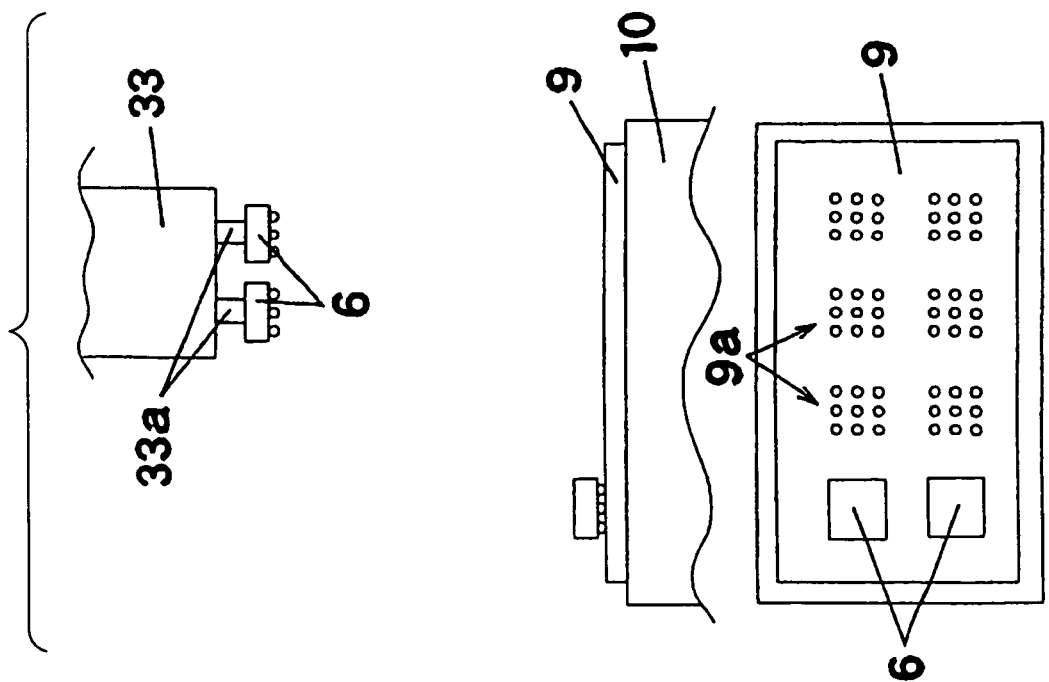

In this case, the holding unit 10 may be freely elevated only over a predetermined elevation stroke by a holding unit elevation mechanism 16 (see FIG. 2). A height of the board 9 under such a condition that the holding unit 10 has been ascended (see FIG. 2 and FIG. 13) becomes equal to a component mounting height in the case that the chip 6 is mounted on the board 9 by a mounting head 33 (will be explained later) A height of the board 9 under such a condition that the holding unit 10 has been descended (see FIG. 12 and FIG. 13) becomes equal to an observation height in the case that both the chip 6 and the electronic component mounting portion 9a are observed by an observation head 34 (will be discussed later).

In FIG. 1, on both edge portions of the upper plane of the base 1, both a first Y-axis base 20A and a second Y-axis base 20B are arranged in such a manner that longitudinal directions of the first Y-axis base 20A and the second Y-axis base 20B are directed to the Y direction which is intersected to the board convey direction (X direction). Y-directional guides 21 are arranged over a substantially entire length thereof along a longitudinal direction (Y direction) on upper planes of the first Y-axis base 20A and the second Y-axis base 20B. A pair of the Y-directional guides 21 are arranged in such a mode that the paired Y-directional guides 21 are located in parallel to each other and sandwich both the electronic component supply unit 2 and the holding unit 10.

Three beams are slidably installed on these paired Y-directional guides 21 along the Y direction in such a manner that both edge portions of each of the three beams (namely, first beam member 31, center beam member 30, and second beam member 32) are supported by the Y-directional guides 21.

While a nut member 23b is projectedly provided on a right-sided side edge portion of the center beam member 30, a feed screw 23a which is meshed with this nut member 23b is rotated by a Y-axis motor 22 which is arranged on the first Y-axis base 20A along the horizontal direction. Since the Y-axis motor 22 is driven, the center beam member 30 is horizontally moved in the Y direction along the Y-directional guides 21.

Also, a nut member 25b and another nut member 27b are projectedly provided on left-sided side edge portions of the first beam member 31 and the second beam member 32, respectively. A feed screw 25a and another feed screw 27a, which are meshed with the nut members 25b and 27b, are rotated by a Y-axis motor 24 and another Y-axis motor 26, which are arranged on the second Y-axis base 20B along the horizontal direction, respectively. Since the Y-axis motors 24 and 26 are driven, both the first beam member 31 and the second beam member 32 are horizontally moved in the Y direction along the Y-directional guides 21.

While the mounting head 33 is mounted on the center beam member 30, a feed screw 41a which is meshed with the nut member 41b coupled to the mounting head 33 is rotated by an X-axis motor 40. The mounting head 33 is guided by X-directional guides 42 (see FIG. 2) along the X direction, and the X-directional guides 42 are provided on the side plane of the center beam member 30 along the X direction.

The mounting head 33 is equipped with a plurality (four pieces in this case) of nozzles (mounting nozzles) 33a which each suck and hold one piece of the chip 6. The mounting head 33 maybe moved under such a condition that while the respective chips 6 are sucked/held by the respective nozzles 33a, this mounting head 33 holds the plural chips 6. Then, the mounting head 33 owns a mounting nozzle elevation mechanism which separately elevates these nozzles 33a, and can mount the chips 6 by picking up separately these chips 6 by the respective nozzles 33a.

Since both the Y-axis motor 22 and the X-axis motor 40 are driven, the mounting head 33 is horizontally moved along both the X direction and the Y direction. The chips 6 of the electronic component supplying unit 2 are sucked/held by the plural nozzles 33a, and the mounting head 33 mounts these chips 6 on a plurality of electronic component mounting portions 9a (see FIG. 5) formed on the board 9 which is held by the holding unit 10.

One pair of Y-directional guides 21, the center beam member 30, a Y-directional drive mechanism (namely, Y-axis motor 22, feed screw 23a, and nut member 23b) and an X-directional drive mechanism (namely, X-axis motor 40, feed screw 41a, and nut member 41b) constitute a mounting head transport mechanism 59 (see FIG. 10) which transports the mounting head 33 between the electronic component supplying portion 2 and the holding unit 10. The Y-directional drive mechanism transports the center beam member 30 along the Y-directional guides 21. The X-directional drive mechanism transports the mounting head 33 along the X-directional guides 42.

An observation head 43 equipped with a lens-barrel portion 34a which is elongated along the horizontal direction is mounted on the first beam member 31, and a nut member 44b is coupled to a bracket 34b which holds the observation head 34. A feed screw 44a which is meshed with the nut member 44b is rotated by the X-axis motor 43, and since the X-axis motor 43 is driven, the observation head 34 is guided by an X-directional guide 45 (see FIG. 2) which is provided on the side plane of the first beam member 31 so as to be transported along the X direction.

As indicated in FIG. 3, both a provisional positioning camera 15 and a reversing stage 17 are arranged between the electronic component supplying portion 2 and the holding unit 10. While the provisional positioning camera 15 is equipped with a line camera, since the mounting head 33 in which the chip 6 is held by the nozzle 33a is transported above the provisional positioning camera 15, the provisional positioning camera 15 acquires an image of the chip 6 held by the nozzle 33a. Then, this acquired image is recognizing-processed by an electronic component provisional recognizing unit 57 (FIG. 10, will be explained later), so that a position of the chip 6 is recognized. As will be explained later, this positional recognition corresponds to a provisional recognition for provisionally positioning the chip 6 to the electronic component mounting portion 9a on the board 9.

Figure 4:
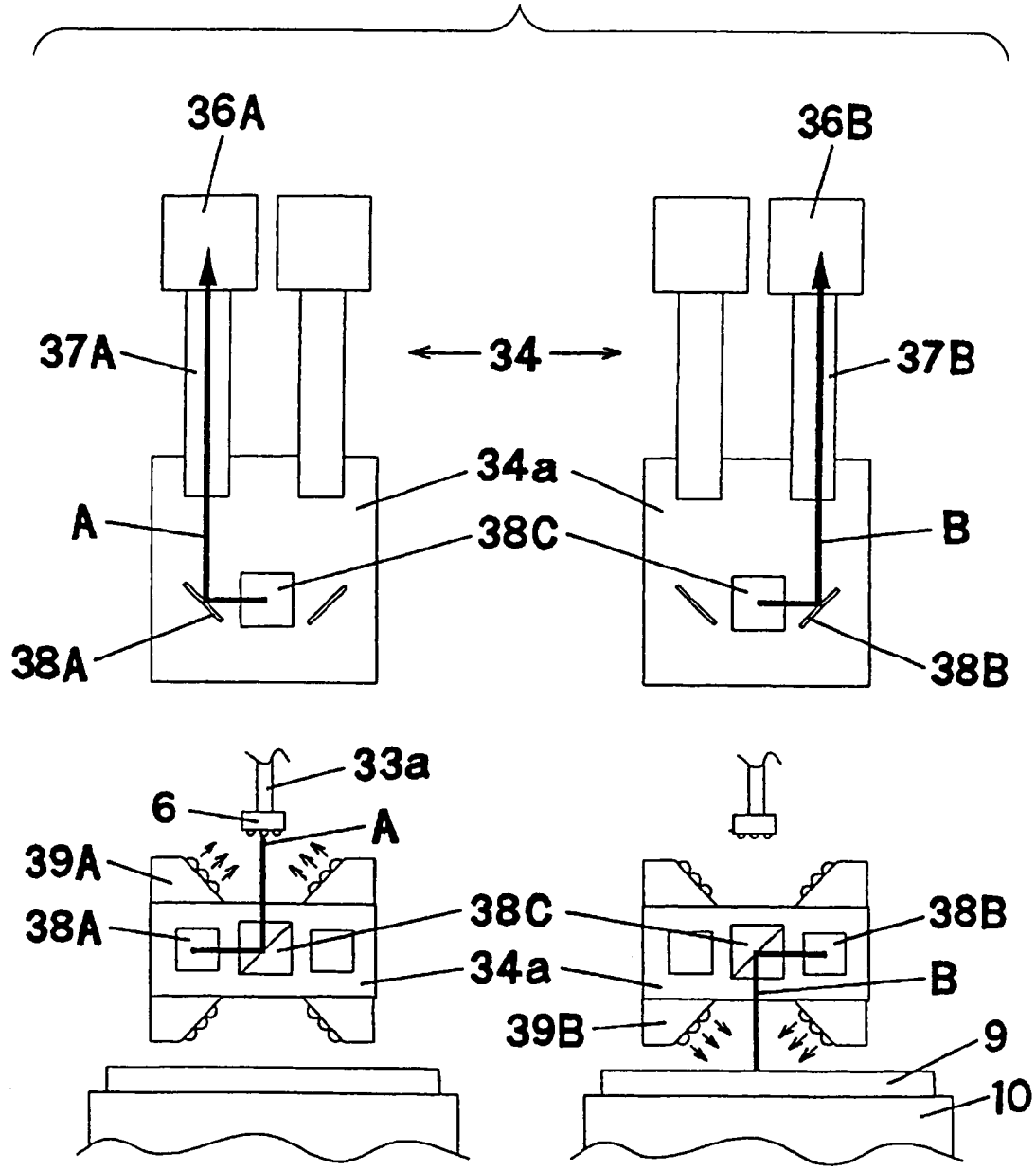
FIG. 4 is a function explanatory diagram for explaining an observation head of the electronic component mounting apparatus according to the embodiment 1 of the present invention.

Now, a function of the observation head 34 will be explained with reference to FIG. 4. As indicated in FIG. 4, the observation head 34 is constituted by that both an electronic component-imaging camera 36A which observes the chip 6 and a board-imaging camera 36B which observes the electronic component mounting portion 9a of the board 9 are combined via a lens 37A and another lens 37B with the lens-barrel portion 34a.

An illuminating unit 39A and another illuminating unit 39B are provided-on both an upper plane and a lower plane of the lens-barrel portion 34a. These illuminating units 39A and 39B illuminate illuminating light with respect to the chip 6 and the board 9, which correspond to observation objects.

A mirror 38A and another mirror 38B are arranged at positions for conducting incident light to the lenses 37A and 37B within the lens-barrel portion 34a, and furthermore, a prism 38C are built in this lens-barrel portion 34a. This prism 38C reflects the incident light entered from both the upper and lower directions to any one of the mirrors 38A and 38B.

Since the lens-barrel portion 34a is advanced to a space defined between the two observation objects which are positioned along both the upper/lower directions and then the prism 38C is positioned to the observation objects, both an optical path "A" and another optical path "B" are formed at the same time. The optical path "A" is defined from the upper observation object via the prism 38C, the mirror 38A, and the lens 37A to the camera 36A, whereas the optical path "B" is defined from the lower observation object via the prism 38C, the mirror 38B, and the lens 37B to the camera 36B.

In other words, the observation camera 34 is arranged in such a manner that while the respective optical path "A" and optical path "B" of the electronic component-imaging camera 36A and the board-imaging camera 36B are horizontally provided, the prism 38C is contained which causes the optical path "A" of the electronic component-imaging camera 36A to be directed to an upper direction, and also, causes the optical path "B" of the board-imaging camera 36B to be directed to the lower direction at the same position. In this case, both the optical path "A" directed to the upper direction and the optical path "B" directed to the lower direction are located on the same vertical line by adjusting the optical system.

As a consequence, as indicated in FIG. 4, the mirror-barrel portion 34a is advanced to such a space defined between the board 9 held by the holding unit 10 and the nozzle 33a which is positioned above this board 9 by sucking/holding the chip 6, and also, the prism 38C is positioned to both the chip 6 and the electronic component mounting portion 9a of the board 9, so that both an image of the chip 6 and an image of the electronic component mounting portion 9a of the board 9 are acquired at the same time by the electronic component-imaging camera 36A and the board-imaging camera 36B respectively, and thus, the relative positional relationship between the chip 6 and the electronic component mounting portion 9a can be obtained.

In other words, under such a condition that the chip 6 sucked/held by the mounting head 33 has been positionally positioned above the electronic component mounting portion 9a, the observation head 34 acquires both the image of this chip 6 and the image of the electronic component mounting portion 9a from the provisionally-positioned chip 6 and the electronic component mounting portion 9a.

Since both the Y-axis motor 24 and the X-axis motor 43 are driven, the observation head 34 is horizontally transported along the X direction and the Y direction. As a result, the observation head 34 may be moved above the holding unit 10 so as to photograph the board 9 held by the holding unit 10, and also may be moved so as to be evacuated from the upper space of the holding unit 10.

One pair of the Y-directional guides 21, the first beam member 31, a Y-directional drive mechanism (namely, Y-axis motor 24, feed screw 25a, and nut member 25b) and an X-directional drive mechanism (namely, X-axis motor 43, feed screw 44a, and nut member 44b) constitute an observation head transport mechanism 58 (see FIG. 10) which transports the observation head 34. The Y-directional drive mechanism transports the first beam member 31 along the Y-directional guides 21. The X-directional drive mechanism transports the observation head 34 along the X-directional guides 45.

In the electronic component mounting operation, as will be described in detail, the observation head transport mechanism 58 transports the observation head 34 in synchronism with the chips 6 which are sequentially and provisionally positioned by transporting the mounting head 33, and also, evacuates the observation head 34 from the upper space of the holding unit 10 when the chips 6 are mounted on the board 9. The space of a lateral direction (Y direction) of the holding unit 10 constitutes an evacuating position where the observation head 34 is evacuated from the upper space of the holding unit 10.

As previously explained, the holding unit 10 may be elevated by the holding unit elevation mechanism 16. The holding unit elevation mechanism 16 may change an interval between the holding unit 10 and the mounting head 33 in response to operation to be executed. In other words, in such a case that the observation head 34 is advanced to the space defined between the mounting head 33 and the board 9 in order to perform the observation operation, the holding unit elevation mechanism 16 extends the interval defined between the holding unit 10 and the mounting head 33, and after the observation operation is accomplished, this holding unit elevation mechanism 16 narrows this interval. As a consequence, the holding unit elevation mechanism 16 may function as an interval changing means for changing the interval defined between the mounting head 33 and the holding unit 10 after the observation head 34 has been evacuated from the space defined between the own observation head 34 and the mounting head 33.

A wafer-imaging camera 35 is mounted on the second beam member 32, and a nut member 47b is coupled to a bracket 35a which holds the wafer-imaging camera 35. A feed screw 47a which is meshed with the nut member 47b is rotated by an X-axis motor 46. Since this X-axis motor 46 is driven, the wafer-imaging camera 35 is guided by X-directional guides 48 (see FIG. 2) which are provided on the side plane of the second beam member 32 so as to be transported along the X direction.

Since both the Y-axis motor 26 and the X-axis motor 46 are driven, the wafer-imaging camera 35 is horizontally transported along the X direction and the Y direction. As a consequence, the wafer-imaging camera 35 can be transported above the electronic component supplying unit 2 so as to photograph the chip 6 held by the electronic component supplying unit 2, and can be transported so as to be evacuated from the upper space of the electronic component supplying unit 2.

One pair of the Y-directional guides 21, the second beam member 32, a Y-directional drive mechanism (namely, Y-axis motor 26, feed screw 27a, and nut member 27b), and an X-directional drive mechanism (namely, X-axis motor 46, feed screw 47a, and nut member 47b) constitute a wafer-imaging camera transport mechanism for transporting the wafer-imaging camera 35. The Y-directional drive mechanism transports the second beam member 32 along the Y-axis guide 21. The X-directional drive mechanisms transports the wafer-imaging camera 35 along the X-directional guides 48.

Figure 5:
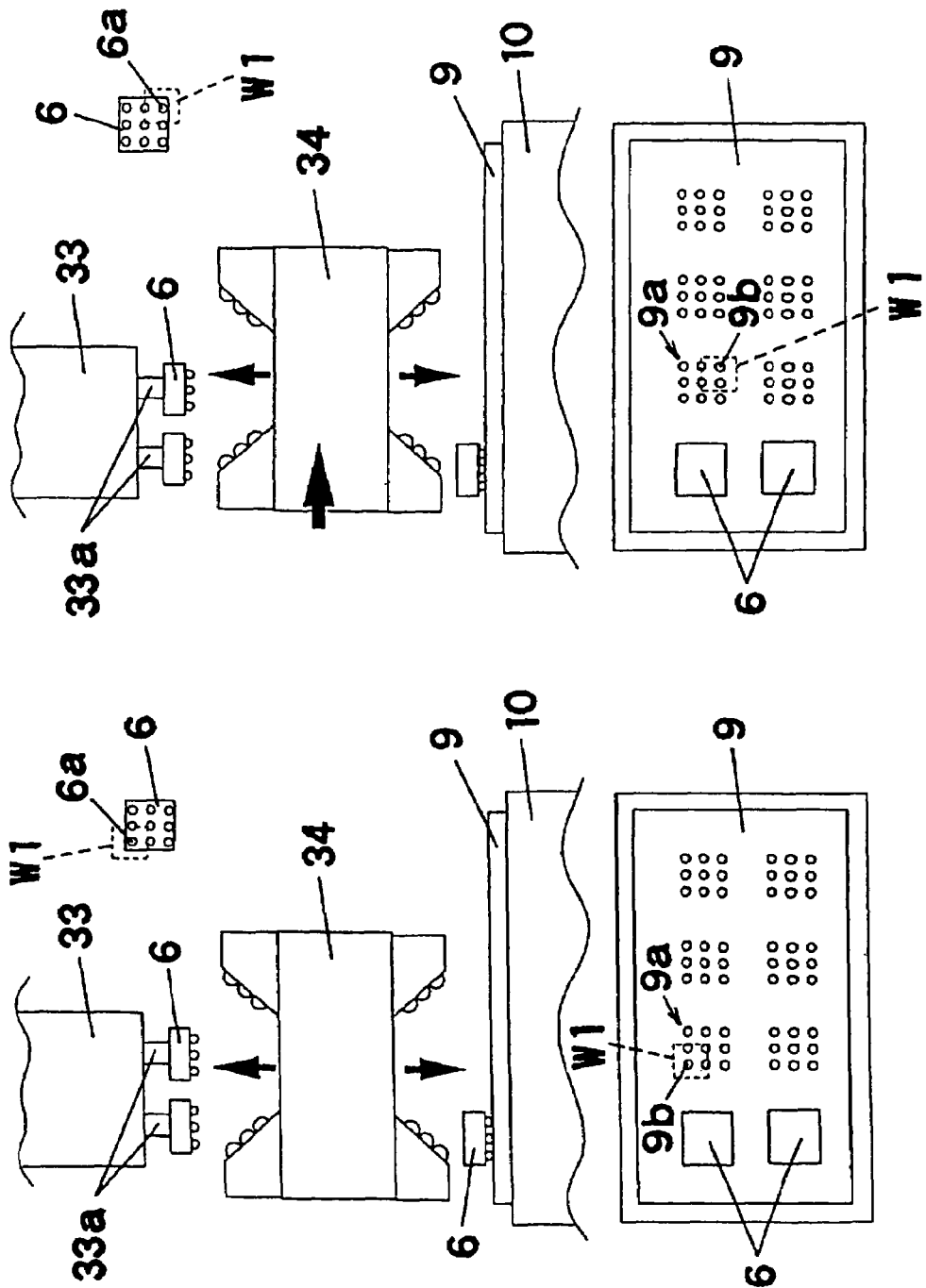
FIGS. 5(a) and 5(b) are explanatory diagrams for explaining an observing method for observing both an electronic component and a board by the observation head of the electronic component mounting apparatus according to the embodiment 1 of the present invention.
Figure 6:
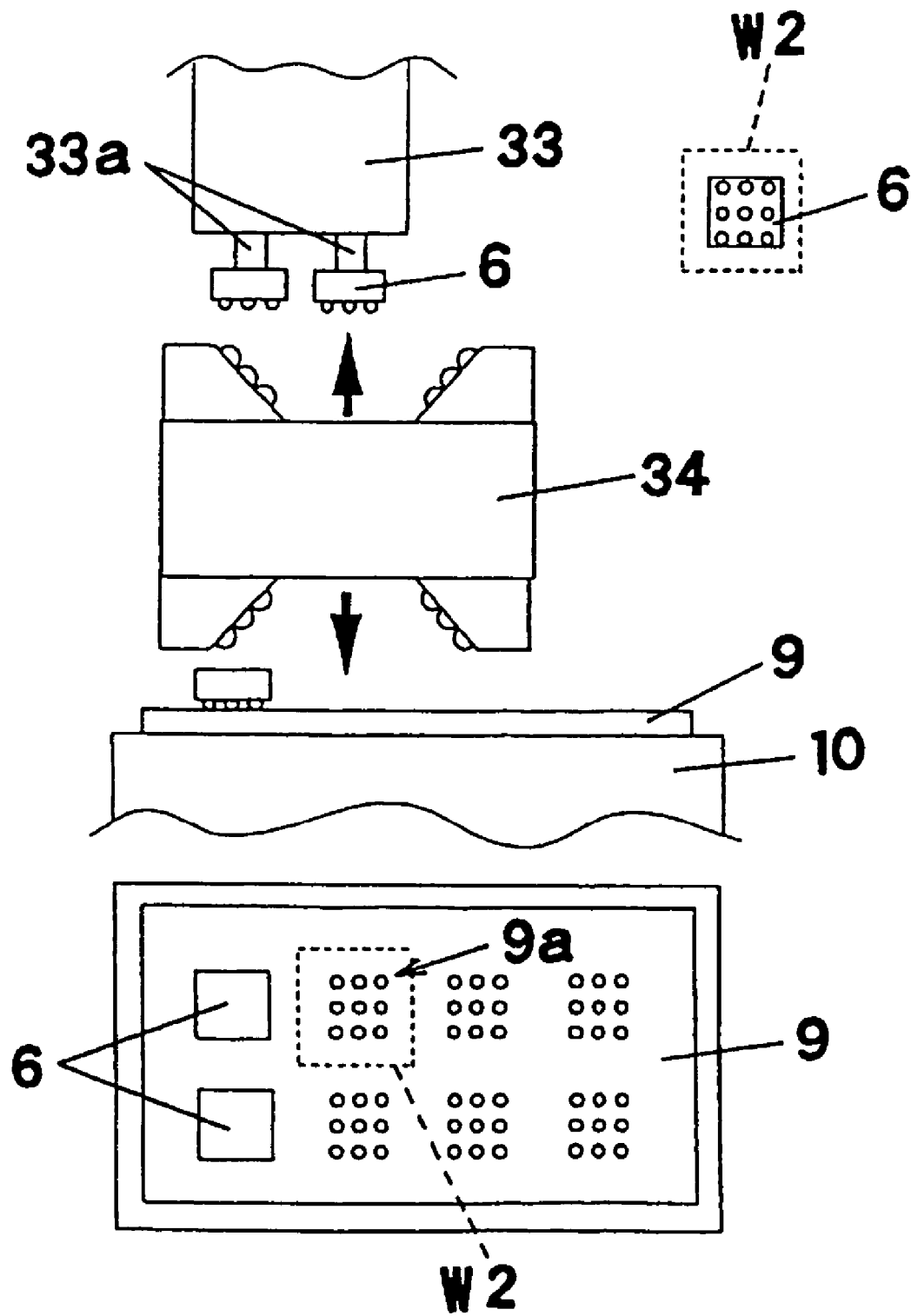
FIG. 6 is an explanatory diagram for explaining an observing method for observing both an electronic component and a board by the observation head of the electronic component mounting apparatus according to the embodiment 1 of the present invention.

Referring now to FIG. 5 and FIG. 6, a description is made of a method for recognizing both the board 9 and the chip 6 by the observation head 31. FIG. 5 indicates a two-point recognizing method in which since 2 points contained in an object to be recognized are recognized, a position of an entire portion of the object to be recognized is recognized. In the case that this 2-point recognizing method is employed, optical magnification of the optical system is increased which is employed so as to perform photographing operations by the electronic component-imaging camera 36A and the board-imaging camera 36B, and a photographing visual field is set to a narrow visual field "W1".

In FIG. 5(a), the board 9 is mounted on the holding unit 10, and the chips 6 have already been mounted on two sets of the electronic component mounting portions 9a among a plurality of these electronic component units 9a formed on the board 9. The mounting head 33 in which the chips 6 have been held by the nozzles 33a is positioned above the holding unit 10. At this time, the mounting head 33 is brought into such a condition that this mounting head 33 has been provisionally positioned substantially just above the electronic component mounting portion 9a corresponding to the chip 6 held by the nozzle 33a.

Under this provisionally positioning condition, the observation head 34 is entered into the space defined between the board 9 and the chip 6 so as to perform photographing operations for simultaneously recognizing both the chip 6 and the board 9. At this time, the observation head 34 is firstly moved in such a manner that the visual fields "W1" of the electronic component-imaging camera 36A and the board-imaging camera 36B may cover both the bump 6a located at a diagonal position of one side of the chip 6, and the electrode 9b located at a diagonal position of one side of the electronic component mounting portion 9a, respectively. Then, both images located within the respective visual fields "W1" are acquired by the electronic component-imaging camera 36A and the board-imaging camera 36B.

Next, as shown in FIG. 5(*b*), the observation head 34 is moved, and then this observation head 34 is transported in such a manner that the visual fields "W1" of the electronic component-imaging camera 36A and the board-imaging camera 36B may cover both the bump 6*a* located at a diagonal position of the other side of the chip 6, and the electrode 9*b* located at a diagonal position of the other side of the electronic component mounting portion 9*a*, respectively. Then, both images located within the respective visual fields "W1" are acquired by the electronic component-imaging camera 36A and the board-imaging camera 36B in a similar manner.

Then, since the image data which have been acquired by the above-described two photographing operations by the observation head 34 are processed by the recognizing operation, both the position of the chip 6 and the position of the electronic component mounting portion 9*a* on the board 9 may be recognized, while this chip 6 is held by the mounting head 33. This two-point recognizing method is employed in such a case that a size of a chip 6 to be checked is excessively large and the entire portion of this chip 6 cannot be stored within the same visual field, and also, high positional recognition precision is required.

In the case that this 2-point recognizing method, since a target point is required to be firmly located within the narrow visual field "W1", as will be explained later, such a provisional recognizing operation is carried out by which the chip 6 set under the condition that this chip 6 is being held by the mounting head 33 is recognized by the provisional positioning camera 15, and then, the mounting head 33 is provisionally positioned based upon this provisional recognition result.

FIG. 6 indicates a batch recognizing method capable of recognizing an entire portion as to the chip 6 and the electronic component mounting portion 9*a* in a batch manner by executing a single photographing operation. In this case, while photographing visual fields of both the electronic component-imaging camera 36A and the board-imaging camera 36B have been set to wide visual fields "W2", the observation head 34 is advanced to the space defined between the chip 6 and the board 9. Then, under this condition, both an entire image of the chip 6 and an entire image of the electronic component mounting portion 9*a* within the respective visual fields "W2" are acquired by the electronic component-imaging camera 36A and the board-imaging camera 36B. It should be understood that when the batch recognizing method is carried out, since any one of the chip 6 and the electronic component mounting portion 9*a* may be easily involved by the wide visual fields "W2", the provisional recognizing operation of the chip 6 by using the provisional positioning camera 15 is not always required.

Figure 7:
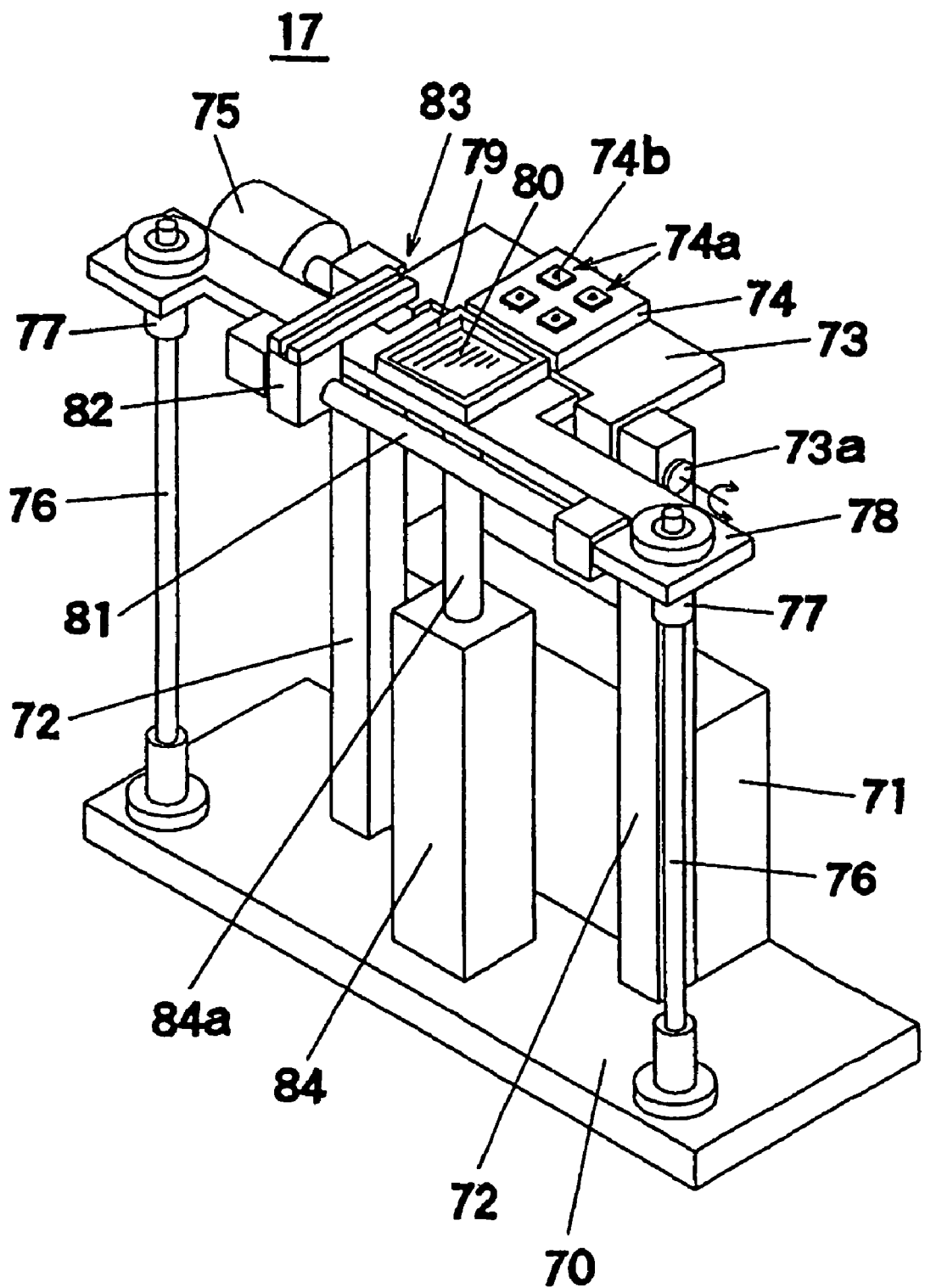
FIG. 7 is a perspective view of a reversing stage of the electronic component mounting apparatus according to the embodiment 1 of the present invention.

Next, the reversing stage 17 corresponding to the up-down reversing means will now be explained with reference to FIG. 7 and FIG. 8. In FIG. 7, two supporting posts 72 coupled to a block 71 are projectedly provided on a horizontal base member 70. A reversing table 73 is rotatably held by the supporting posts 72 around a horizontal shaft 73*a*, and an reversing actuator 75 is coupled to this horizontal shaft 73*a*. Since the reversing actuator 75 is driven, the shaft 73*a* is rotated by 180 degrees, so that the reversing table 73 performs up-down reversing operation.

While a holding head 74 is provided on the reversing table 73, a plurality of chip holding units 74*a* are arrayed on the holding head 74. While the chip holding units 74*a* are equipped with absorption holes 74*b*, the chip holding units 74*a* suck and hold the chips 6 through the absorption holes 74*b* in a vacuum sucking manner under such a condition that the chips 6 whose bump-formed planes are directed to the upper direction have been mounted on the respective chip holding units 74*a*. In other words, the chip holding units 74*a* hold the rear planes of the chips 6 set to such a condition that the bump-formed planes thereof are directed to the upper direction (see FIG. 8(*a*)).

In this case, since the receiving/supplying operations of the chips 6 to the holding head 74 are carried out in such a manner that the chips 6 are picked up from the electronic component supplying unit 2 by the nozzles 33*a* of the mounting head 33 and then the picked chips 6 are transported to the holding head 74 where the chip holding units 74*a* are directed to the upper direction, it is so set that the array of the chip holding units 74*a* in the holding head 74 is made coincident with the array of the nozzles 33*a* of the mounting head 33.

Two slide posts 76 are projectedly provided on the base member 70, and sliders 77 are coupled to an elevation table 78. These sliders 77 are slidably engaged with the slide posts 76 along upper/lower directions. A rod 84*a* of an elevating actuator 84 is coupled to the elevation table 78. Since the elevating actuator 84 is driven, the elevation table 78 is elevated along the slide posts 76.

A stage 79 is provided on an upper plane of the elevation table 78. The stage 79 corresponds to a flat bottom vessel having a flat bottom plane 79*a*. This stage 79 may have a function as a transfer stage and another function as a flatting stage. The transfer stage transfers/coats a flux 80 which has been supplied to the bottom plane to the bump 6*a* of the chip 6. When this transfer operation is carried out, the flatting stage depresses the bump 6*a* so that a tip portion of the bump 6*a* is flatted. Furthermore, this stage 79 owns such a function as an arranging stage for arranging the chips 6 to which the fluxes 80 have been transferred/coated in a predetermined array in order to perform the deriving operation by the mounting head 33 for deriving these chips 6.

A slide cylinder 81 is horizontally arranged on the side plane of the elevation table 78, and this slide cylinder 81 reciprocates the slide block 82 along the horizontal direction. A squeeze unit 83 equipped with two squeezes which can be freely elevated is mounted on the slide block 82 in such a manner that this squeeze unit 83 is elongated upwardly with respect to the stage 79. Since the squeeze unit 83 is horizontally moved so as to execute a flux scraping-up operation and a flux extending operation, a flux film having a preselected thickness, the fluid plane of which has been flatted, is formed on the bottom plane of the stage 79.

Figure 8:
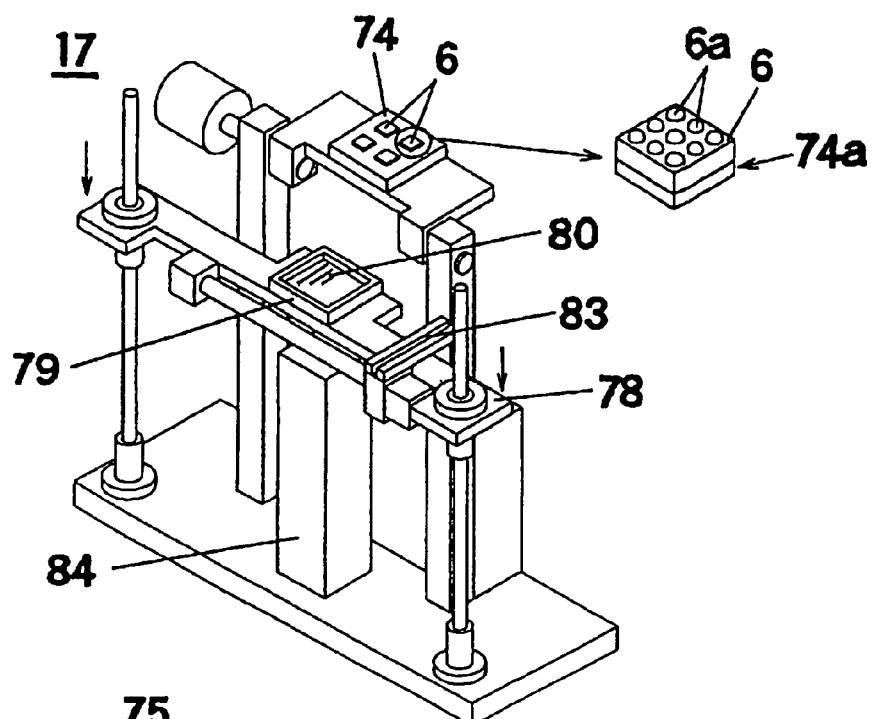
FIGS. 8(a) and 8(b) are operation explanatory diagrams of the reversing stage of the electronic component mounting apparatus according to the embodiment 1 of the present invention.
Figure 8:
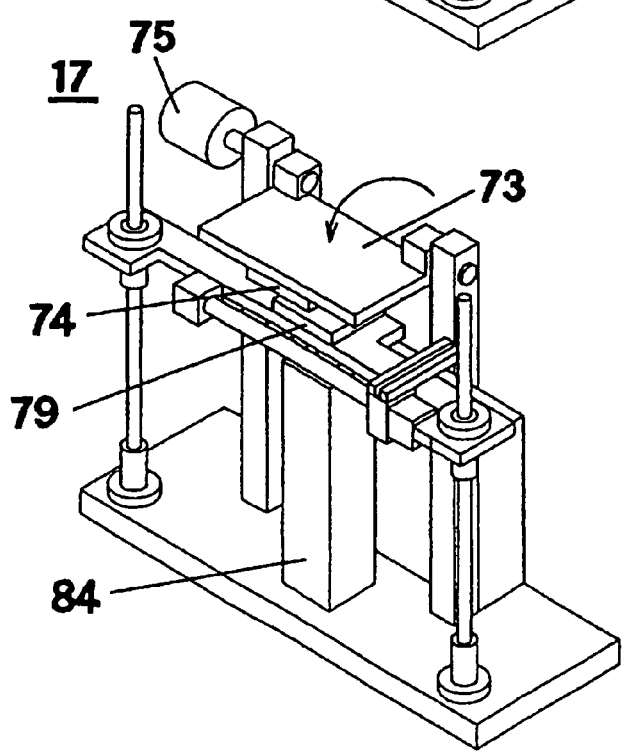

FIG. 8(*a*) indicates such a condition that after the flux film has been formed, the elevating actuator 84 is driven so as to cause the elevation table 78 to descend. As a result, the stage 79 descends up to a transfer height position so as to transfer/coat the flux 80. Then, under this condition, as shown in FIG. 8(*b*), the reversing actuator 75 is driven so as to reverse the reversing table 73 with respect to the stage 79. Next, when a weight for upwardly depressing the stage 79 is exerted by the elevating actuator 84, the lower planes of the bumps 6*a* are depressed against the stage 79 so as to flatting the bumps 6*a*, and also, the flux is transferred/coated to the bumps 6*a*.

When the arranging operation of the chips 6 by the stage 79 to the flux 80 has been accomplished, the elevating actuator 84 is driven so as to cause the elevation table 78 to ascend, and to position the stage 79 at the receiving/supplying height. Under this condition, the chips 6 arranged on the stage 79 are again held by the nozzles 33*a* of the mounting head 33, and then are mounted on the board 9 held by the holding unit 10. As a consequence, the electronic component supplying unit 2, the reversing stage 17, and also, the mounting head 33 which picks up the chips 6 from the electronic component supplying unit 2 to transport the picked chips to the reversing stage 17 constitute an electronic component supplying means. This electronic component supplying means supplies such chips brought into the conditions under which the flux 80 has been transferred/coated and the flatting operation has been accomplished with respect to the mounting head 33 for mounting the electronic components to the board. Also, both the reversing stage 17 and the mounting head 33 for picking up the chips 6 from the electronic component supplying unit 2 to transport the picked chips 6 to this reversing stage 17 constitute an electronic component reversing/supplying means. Under such a condition that the chips 6 are derived from the electronic component supplying unit 2 and are reversed along upper/lower directions, this electronic component reversing/supplying means supplies the reversed chips to the mounting head 33 for mounting the chips 6 onto the board. It should also be noted that in this embodiment, (1) the function as the electronic component transporting mechanism and (2) the function as the mounting mechanism are realized by the single mounting head 33. The electronic component transporting mechanism picks up the chips 6 from the electronic component supplying unit 2 and then transports the picked chips 6 to the reverse stage 17. In the mounting function, the chips 6 which have been reversed from the reversing stage 17 are picked up and then the picked chips are mounted on the board. Alternatively, the electronic component transporting mechanism for picking up the chips 6 from the electronic component supplying unit 2 and for transporting the picked chips 6 to the reverse stage 17 may be separately provided with respect to the mounting head 33.

Then, in such a step that the mounting head 33 is moved to the board 9, the mounting head 33 which has held the chips 6 is moved along the X direction above the provisional positioning camera 15, so that as previously explained, the provisional positioning camera 15 photographs the chips 6 held by the mounting head 33.

Figure 9:
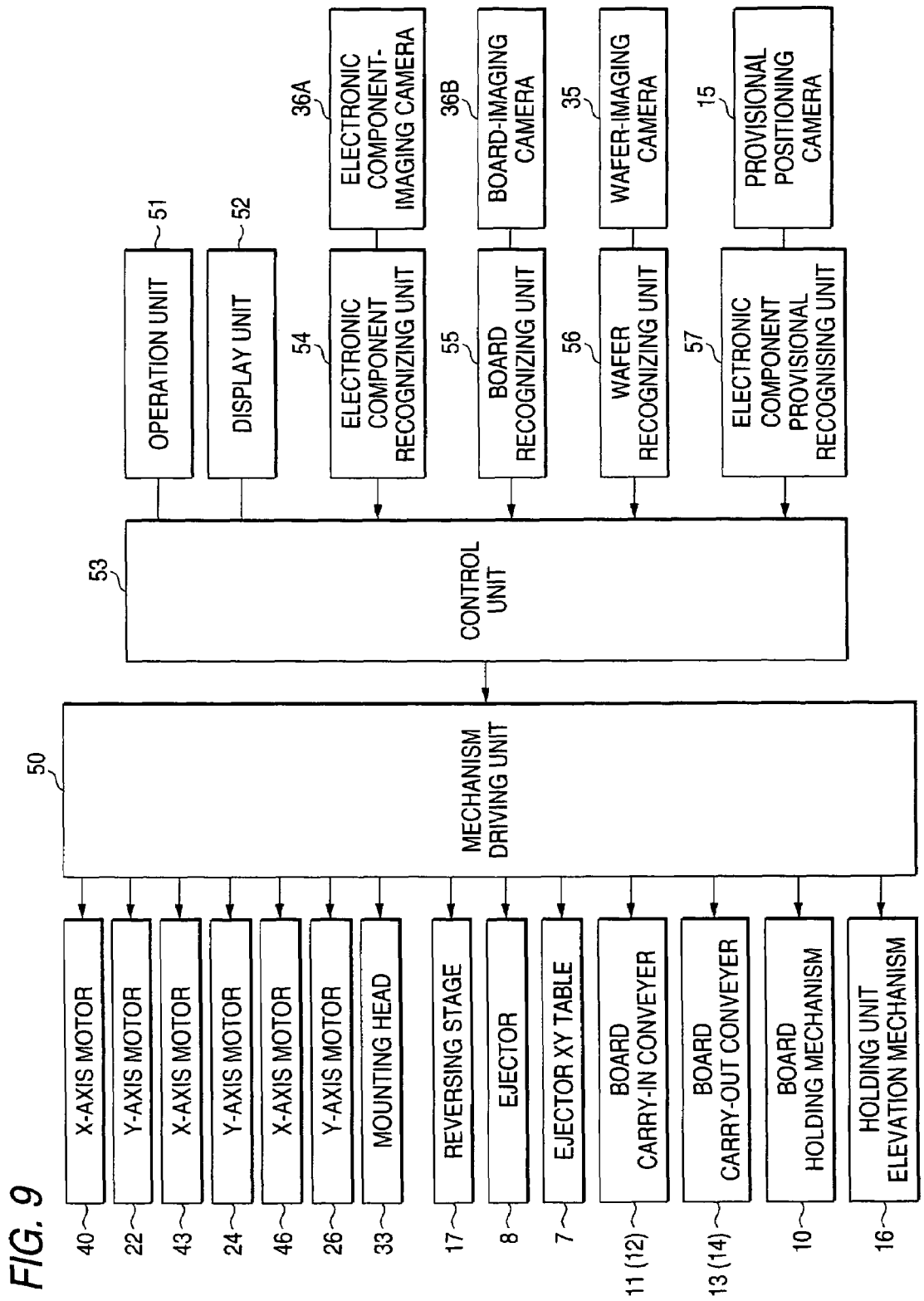
FIG. 9 is a block diagram for indicating an arrangement of a control system of the electronic component mounting apparatus according to the embodiment mode 1 of the present invention.

Referring now to FIG. 9, an arrangement of a control system employed in the electronic component mounting apparatus will be subsequently explained. In FIG. 9, a mechanism driving unit 50 is arranged by a motor driver which electrically drives motors of the above-described respective mechanisms, a control appliance which controls air pressure supplied to air cylinders of the respective mechanisms, and the like. Since the mechanism driving unit 50 is controlled by a control unit 53, the below-mentioned respective drive elements may be driven.

Both the X-axis motor 40 and the Y-axis motor 22 drive the mounting head transport mechanism for transporting the mounting head 33. The X-axis motor 43 and the Y-axis motor 24 drive the observation head transport mechanism 58 for transporting the observation head 34, whereas the X-axis motor 46 and the Y-axis motor 26 drive the wafer-imaging camera transport mechanism for transporting the wafer-imaging camera 35.

Also, the mechanism driving unit 50 drives the mounting nozzle elevation mechanism of the mounting head 33, and the component absorption mechanism by the nozzles 33a (see FIG. 2), and also, drives the reversing actuator 75 of the reversing stage 17, the elevating actuator 84, the drive motor of the ejector 8, and the drive motor of the ejector XY table 7. Furthermore, the mechanism driving unit 50 drives the board carry-in conveyers 11 and 12, the board carry-out conveyers 13 and 14, the board hold mechanism of the holding unit 10, and the holding unit elevation mechanism 16 for elevating the holding unit 10.

An electronic component recognizing unit 54 performs a recognizing process operation as to an image photographed by the electronic component-imaging camera 36A of the observation head 34 so as to recognize a position of a chip 6 which has been sucked/held by the nozzle 33a of the mounting head 33. A board recognizing unit 55 executes a recognizing process operation as to an image photographed by the board-imaging camera 36B of the observation head 34 so as to recognize a position of the electronic component mounting portion 9a of the board 9 held by the holding unit 10. In the board 9, the electrodes 9b to which the bumps 6a of the chips 6 are jointed are handled in the chip unit, and the electronic component mounting portion 9a can detect the positions by way of the image recognizing process operation.

A wafer recognizing unit 56 processes an image photographed by the wafer-imaging camera 35 in order to acquire a position of a chip 6 of the electronic component supplying unit 2. An electronic component provisional recognizing unit 57 performs a recognizing process operation as to an image photographed by the provisional positioning camera 15 so as to acquire a position of a chip 6 held by the mounting head 33. This position recognition is employed in the case that the mounting head 33 is provisionally positioned on the board 9, as previously described.

The recognition results acquired by the electronic component recognizing unit 54, the board recognizing unit 55, the wafer recognizing unit 56, and the electronic component provisionally recognizing unit 57 are fed to the control unit 53. An operation unit 51 corresponds to an input apparatus such as a keyboard and a mouse. This operation unit 51 inputs data, inputs a control command, and sets an operation mode (will be discussed later). A display unit 52 displays thereon images which are photographed by the observation head 34, the wafer-imaging camera 35, and the provisional positioning camera 15, and also displays thereon a guide screen when the operation unit 51 performs the input operation.

While this electronic component mounting apparatus is arranged as explained above, both operation modes of the electronic component mounting apparatus and electronic component mounting operations in the respective operation modes will be explained as follows: That is, in the electronic component mounting apparatus according to this embodiment, three operation modes constructed of a high precision mode, a standard mode, and a high speed mode may be selected in response to required mounting precision. Switching of these operation modes may be set by operating the operation unit 51.

Next, referring now to FIG. 10 to FIG. 15, a description is made of both a processing function and an electronic component mounting operation of the electronic component mounting apparatus executed in the standard mode. The electronic component mounting operation by the standard mode contains: a step in which chips (electronic components) 6 are sucked/held by a plurality of nozzles (mounting nozzles) 33a of the mounting head 33; a provisional positioning step in which a chip 6 which has been sucked/held by one nozzle among the plural nozzles 33a is provisionally positioned above one electronic component mounting portion 9a; an observing step in which both an image of the provisionally positioned chip 6 and an image of the electronic component mounting portion 9a are acquired by the observation head 34 located in a space defined between this provisionally positioned chip 6 and the electronic component mounting portion 9a; a relative positional relationship detecting step in which a relative positional relationship between the chip 6 and the electronic component mounting portion 9a is detected based upon both the image of the chip 6 and the image of the electronic component mounting portion 9a, which have been acquired in the observing step; a provisional positioning step for provisionally positioning all of the chips which have been sucked/held by other nozzles 33a; an observing step; a step for performing the relative positional relationship detecting step; an observing head evacuating step for evacuating the observation head 34 from the upper space of the board 9; and such a step in which such an operation for positioning the chips sucked/held by the plural nozzles 33a with respect to the electronic component mounting portions 9a by reflecting the relative positional relationship acquired in the relative positional relationship detecting step so as to transport the mounting head 33 is sequentially carried out with respect to all of the chips sucked/held by the nozzles 33a.

Figure 10:
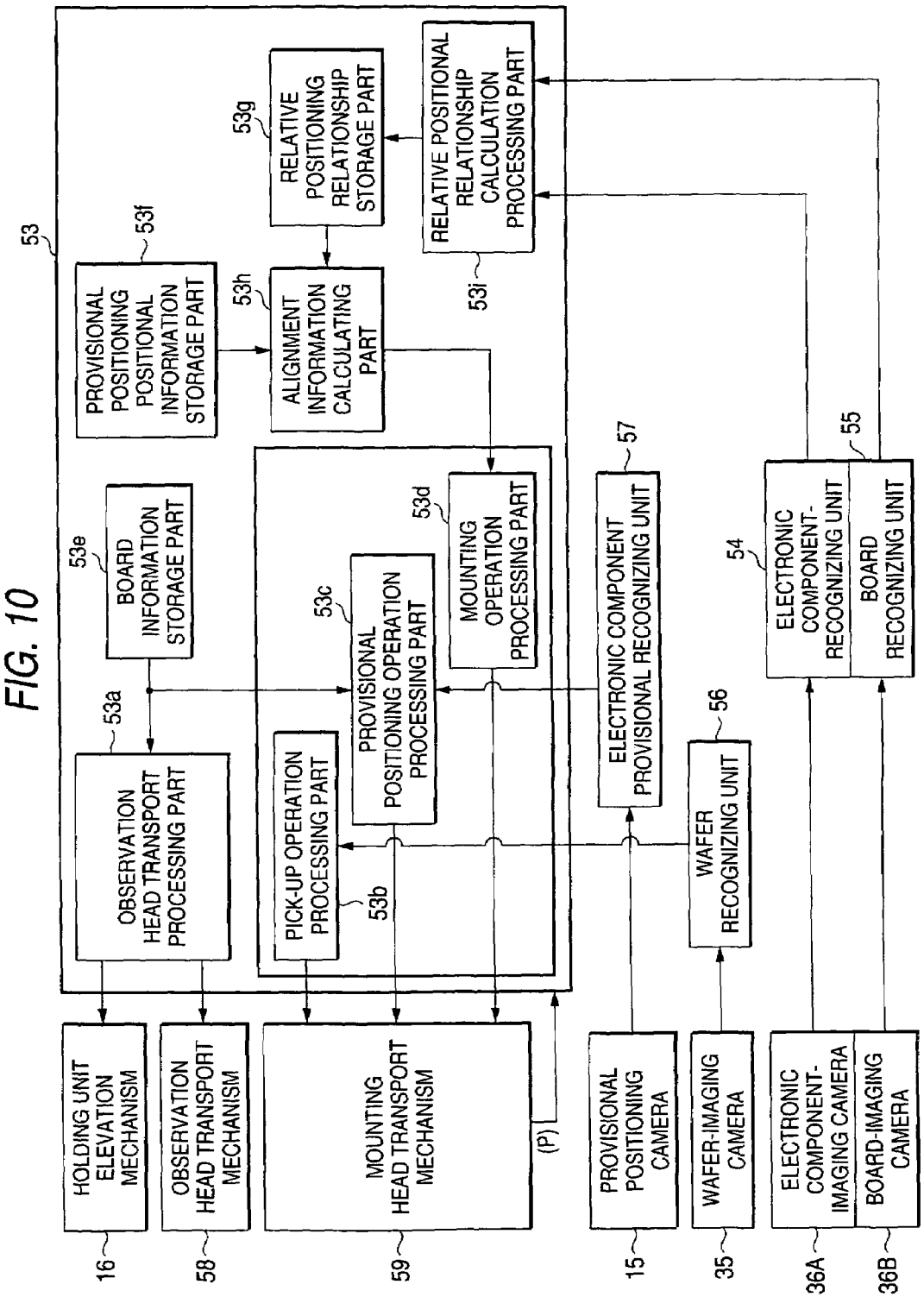
FIG. 10 is a functional block diagram for showing processing functions in the case of a standard mode of the electronic component mounting apparatus according to the embodiment 1 of the present invention.

In FIG. 10, a rectangular frame 53 indicates a processing function of the control unit 53 in the standard mode. As will be explained later, the control unit 53 owns a function as a control means. That is, this control means controls the mounting head transport mechanism 59 based upon the image of the chip 6 and the image of the electronic component mounting portion 9a acquired by the observation head 34, and sequentially positions the chips 6 sucked/held by the respective nozzles 33a to the electronic component mounting portions 9a corresponding thereto.

A detailed function of the control unit 53 is explained. While the control unit 53 contains a storage function, this control unit 53 is provided with three storage parts, namely, a board information storage part 53e, a provisional-positioning positional information storage part 53f, and a relative positional relationship storage part 53g. The board information storage part 53e stores thereinto such information as to the board 9 on which the chips are mounted, namely, a board size, array information (longitudinal/lateral pitch and pitch number) of the electronic component mounting portions 9a (see FIG. 5 and FIG. 6) on which the chips 6 are mounted with respect to the board 9, and positions of recognition marks formed on the board 9.

The provisional-positioning positional information storage part 53f stores thereinto such a positional information which indicates a stop position of the mounting head 33 when the chip 6 sucked/held by the nozzle 33a of the mounting head 33 is provisionally positioned above the electronic component mounting portion 9a of the board 9. In other words, mounting head positional information (p) outputted from the mounting head transport mechanism 59 is stored as the provisional-positioning positional information every set of the chip 6 and the electronic component mounting portion 9a in the provisional-positioning positional information storage part 53f. The relative positional relationships between the chips 6 and the electronic component mounting portions 9a, which are acquired by a relative positional relationship calculating process part 53i (will be explained later) every a set of the chip 6 and the electronic component mounting portion 9a.

This relative positional relationship indicates such a relative positional relationship between such a chip 6 and the electronic component mounting portion 9a corresponding to this chip 6 under such a condition that the mounting head 33 in which this chip 6 is held by the nozzle 33a is provisionally positioned with respect to the board 9. In other words, this relative positional relationship represents a positional shift of the chip 6 along the horizontal direction with respect to the electronic component mounting portion 9a. This relative positional relationship is acquired by photographing both the chip 6 and the board 9 by the observation head 34.

Since an image data obtained by photographing a chip 6 by the electronic component-imaging camera 36A is recognized/processed by the electronic component recognizing unit 54, positional information of this chip 6 may be acquired. Also, since image data obtained by photographing the board 9 by the board-imaging camera 36B is recognized/processed by the board recognizing unit 55, positional information of the electronic component mounting portion 9a may be acquired. Then, based upon both the positional information of the chip 6 and the positional information of the electronic component mounting portion 9a, a relative positional relationship between the chip 6 and the electronic component mounting portion 9a may be calculated by the relative positional relationship calculating process part 53i.

In other words, the relative positional relationship calculating process part 53i acquires relative positional relationships between the chips 6 sucked/held by the mounting head 33 and the electronic component mounting portions 9a based upon both the images of the chips 6 and the images of the electronic component mounting portions 9a, which have been acquired by the observation head 34 every a set of the chip 6 and the electronic component mounting portion 9a.

An alignment information calculating part 53h calculates alignment information used to position the mounting head 33 based upon both the provisional positioning position and the relative positional relationship, which are stored in the provisional-positioning positional information storage part 53f and the relative positional relationship storage part 53g respectively every the set of the chip 6 and the electronic component mounting portion 9a. This alignment information indicates a final target position of the mounting head 33 in the mounting operation for mounting the chip 6 on the electronic component mounting portion 9a of the board 9. This alignment information is outputted in such a form at which contains a correction amount used to correct a relative positional shift between the above-described chip 6 and the electronic component mounting portion 9a.

An observation head transport processing part 53a controls both the holding unit elevation mechanism 16 and the observation head transport mechanism 58 based upon the array information of the electronic component mounting portions 9a, which is contained in the board information stored in the board information storage part 53e so as to execute a positioning operation of the observation head 34 when the board 9 held by the holding unit 10 is photographed, and also, an evacuating operation for transporting the observation head 34 to such a position which does not disturb the mounting operation of the chip 6 by the mounting head 33.

The observation head 34, the observation head transport mechanism 58, and the observation head transporting process part 53a constitute an observation means equipped with the observation head 34, which acquires both the image of the provisionally-positioned chip 6 and the image of the electronic component mounting portion 9a from the space defined between this chip 6 and the electronic component mounting portion 9a every a set of the chip 6 and the electronic component mounting portion 9a.

A pick-up operation processing part 53b controls the mounting head transport mechanism 59 so as to execute a positioning operation of the mounting head 33 when a chip 6 is picked up from the electronic component supplying unit 2 based upon the position of this chip 6 in the electronic component supplying unit 2. The position of this chip 6 may be acquired by recognizing/processing a photographed image by the wafer-imaging camera 35 by a wafer recognizing unit 56.

A provisional-positioning operation processing part 53c controls the mounting head transport mechanism 59 so as to sequentially position the chips 6 sucked/held by the plural nozzles 33a above the electronic component mounting portion 9a. This provisional positioning operation is carried out based upon both the array information of the electronic component mounting portion 9a stored in the board information storage part 53e and the position of the chip 6 under holding condition by the mounting head 33. A position of the chip 6 may be acquired by that the chip 6 held by the mounting head 33 is photographed by the provisional positioning camera 15, and then, this photographed result is recognized/processed by an electronic component provisionally recognizing unit 57.

A mounting operation processing part 53d controls the mounting head transport mechanism 59 based on the alignment information calculated by the alignment information calculating part 53h so as to sequentially position the chips 6 held by the respective nozzles 33a with respect to the corresponding electronic component mounting portions 9a of the board 9.

Next, the electronic component mounting operation in the standard mode will now be described in accordance with a flow chart of FIG. 11 with reference to FIG. 12 to FIG. 15. In this mounting operation, as shown in FIG. 5 and FIG. 6, such an operation example is represented in the case that a mounting operation is continuously executed with respect to the board 9 on which the chips 6 have already been mounted.

Figure 11:
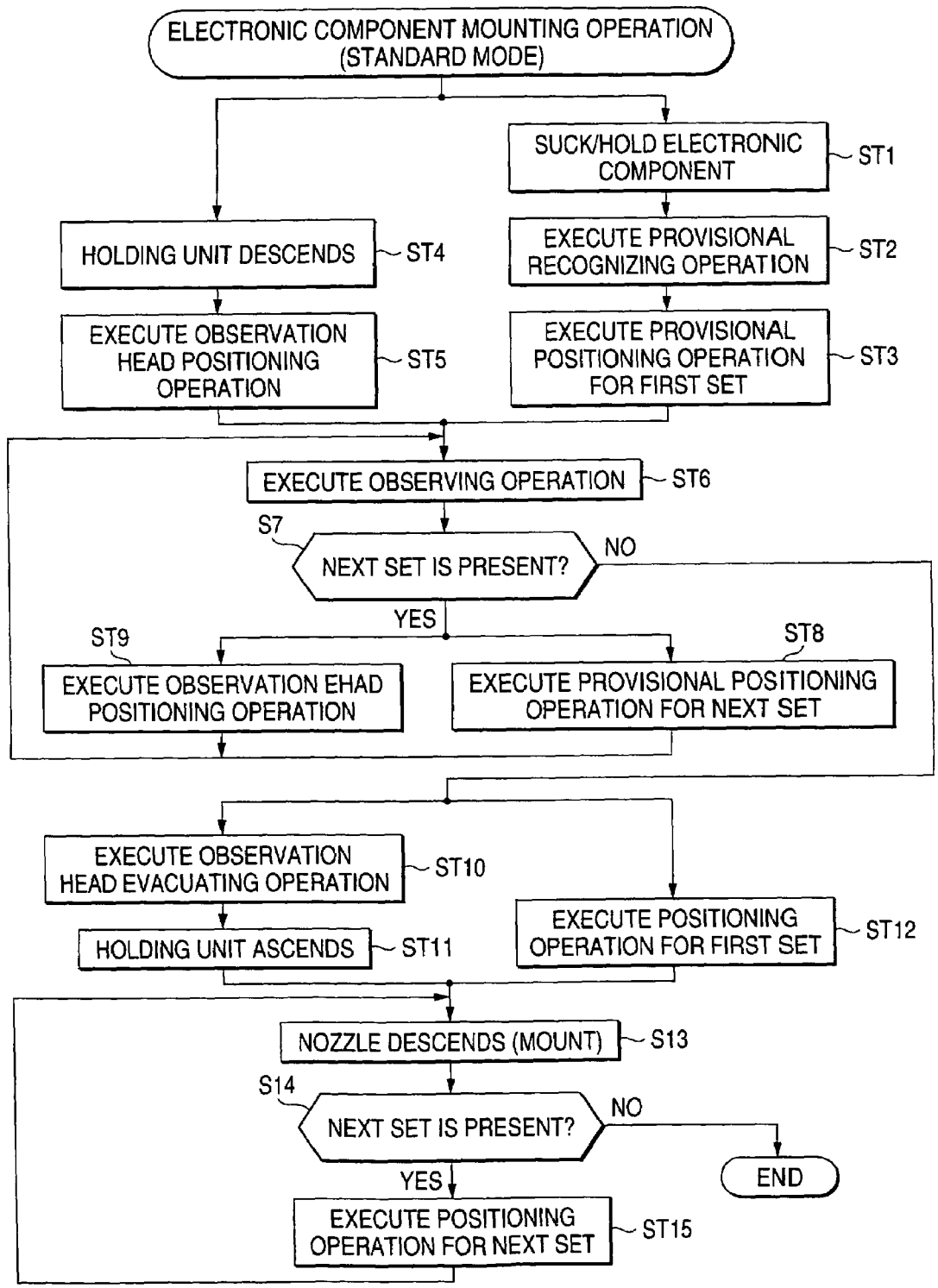
FIG. 11 is a flow chart for explaining an electronic component mounting method (standard mode) of the embodiment 1 of the present invention.

In FIG. 11, an electronic component sucking/holding operation is firstly carried out (ST1). That is to say, the chips 6 are sucked/held from the stage 79 (refer to FIG. 7 and FIG. 8) by a plurality of nozzles 33a of the mounting head 33 (component holding step). Then, while the mounting head 33 which has held a chip 6 passes through an upper space of the provisional positioning camera 15, a provisional recognizing operation of this chip 6 is carried out (ST2) As a result, the chip 6 under the holding condition by the mounting head 33 is photographed and then a position of this photographed chip 6 is recognized. Then, based upon this provisional recognizing result, a provisional positioning operation as to a first set is carried out (ST3). In other words, the mounting head 33 is moved over the board 9 held by the holding unit 10, and then, the chip 6 which is sucked by one nozzle among the plural nozzles 33a of the mounting head 33 is provisionally positioned over one electronic component mounting portion 9a corresponding to this one chip 6 (provisional positioning step).

In this step, first of all, the chip 6 (namely, chip 6 held by right-sided nozzle 33a in FIG. 12(a)) which is held by the mounting head 33 is provisionally positioned to a first electronic component mounting portion 9a (namely, electronic component mounting portion 9a adjacent to right side of previously mounted chip 6) of the board 9 in this mounting operation. This provisional positioning operation is carried out both the above-described provisional recognition result and the array information of the electronic component mounting portion 9a stored in the board information storage part 53e.

In parallel to these operations, a holding unit descending operation is carried out in the holding unit 10 (ST4). As a result, a space where the observation head is advanced may be secured over the holding unit 10. Then, under this condition, as shown in FIG. 12(a), the observation head 34 is advanced to such a space defined between the board 9 and the chip 6 held by the mounting head 33, and then, an observation head positioning operation is carried out (ST5).

Thereafter, an observation operation is carried out (ST6), so that both an image of the provisionally positioned chip 6 and an image of the electronic component mounting portion 9a are acquired by the observation head 34 which is located in the space defined between this chip 6 and the electronic component mounting portion 9a (observation step). In this step, first of all, as represented in FIG. 12(a), both the image of the provisionally positioned chip 6 and the image of the electronic component mounting portion 9a are acquired by using the board-imaging camera 36B and the electronic component-imaging camera 36A respectively, while the above-described first set is recognized as a recognizing subject. In this example, the batch recognizing method (see FIG. 6) is employed by which recognizing subjects are recognized via the wide visual field "W2" in the batch manner. Then, the position of the mounting head 33 is stored into the provisional positioning positional information storage part 53f in relation to the set constituted by both this chip 6 and the electronic component mounting portion 9a as such a provisional positioning positional information.

Thereafter, a relative positional information as to both this chip 6 and the electronic component mounting portion 9a is detected based upon the image of the chip 6 and the image of the electronic component mounting portion 9a, which have been acquired in the observation step (relative positional relationship detecting step). In other words, based upon both the images of the chip 6 and the electronic component mounting portion 9a, a position of this chip 6 and a position of the electronic component mounting portion 9a are recognized by the electronic component recognizing unit 54 and the board recognizing unit 55, and then, a relative positional relationship between the chip 6 and the electronic component mounting portion 9a is calculated by the relative positional relationship calculating process part 53i. The calculation result is stored into the relative positional relationship storage part 53g in relation to the set of the chip 6 and the electronic component mounting portion 9a corresponding thereto (storage step).

Next, a judgement is made as to whether or not there is another set constituted by a next chip 6 and a next electronic component mounting portion 9a (ST7). When there is the next set, both a provisional positioning operation (ST8) for the next set and an observation head positioning operation (ST9) for the next set are executed. Contents of these operations are the same as those of the operations indicated in (ST3) and (ST5) respectively. In other words, as shown in FIG. 12(b), both the mounting head 33 and the observation head 34 are moved so as to position the next chip 6 to the next electronic component mounting portion 9a. At this time, the operation of the observation head 34 is carried out in synchronism with the movement of the chip 6 by the mounting head 33.

Then, thereafter, the process operation is returned to the step (ST6) in which an observing operation by the observation head 34 is carried out. Until such a confirmation is made that there is no next set in the subsequent step (ST7), a provisional positioning step, an observing step, and a relative positional relationship detecting step are sequentially carried out with respect to all of the chips which are sucked/held by other nozzles 33a.

When the respective steps of the provisional positioning operation, the observing operation, and the relative positional relationship detecting operation have been accomplished as to all of these sets, an observation head evacuating operation (ST10) is carried out, and subsequently, a holding unit ascending operation (interval changing step) is carried out (ST11). In other words, as shown in FIG. 13(a), the observation head 34 is evacuated from the upper space of the board 9 (observation head evacuating step). Next, as indicated in FIG. 13(b), the holding unit 10 is caused to ascend up to a component mounting height. Then, in parallel to these operations, the first set of the chip 6 is positioned with respect to such an electronic component mounting portion 9a (namely, both left-sided chip 6 held by mounting head 33 and second electronic component mounting portion 9a from previously mounted chip 6) (ST12).

When this positioning operation is carried out, first of all, the alignment information calculating part 53h reads out both provisional positioning positional information and relative positional information as to the relevant set from the provisional positioning positional information storage part 53f and the relative positional relationship storage part 53g, and then, calculates alignment information required for the positioning operation based upon both the read provisional positioning positional information and the read relative positional relationship (alignment information calculating step). Then, the mounting operation processing part 53d controls the mounting head transport mechanism 59 based upon the calculated alignment information so as to execute the positioning operation of the mounting head 33.

Then, thereafter, as indicated in FIG. 14(b), the nozzle 33a which has held the first set of the above-explained chip 6 is caused to descend so as to mount the chip 6 on the electronic component mounting portion 9a of the board 9 (ST13). Next, a check is made as to whether or not there is a next set whose chip 6 will be mounted (ST14). As indicated in FIG. 14(b), when there is the next set, a positioning operation is carried out with respect to this next set (ST15). Then, the mounting operation is returned to the previous step (ST13). In this step (ST13), as shown in FIG. 15(a) and FIG. 15(b), the nozzle 33a is caused to descend so as to mount the chip 6 on the board 9.

In other words, while the relative positional relationship detected in the relative positional relationship detecting step is reflected to the transport of the mounting head 33, since the mounting head 33 is moved, the mounting operation in which the chips 6 sucked/held by the plural nozzles 33 are positioned with respect to the electronic component mounting portions 9a so as to be mounted on the board 9 is carried out as to all of the chips sucked/held by the nozzles 33a of the mounting head 33. Then, in a step (ST14), a confirmation is made that there is no next set and also the chip mounting operations have been accomplished as to all of the chips 6, and then, the electronic component mounting operation is ended.

As previously explained, the electronic component mounting method in the standard mode is realized by sequentially executing the below-mentioned mounting operations. That is, when the chips 6 are mounted on the board 9 by using the mounting head 33 equipped with a plurality of nozzles 33a, the observing operations are previously carried out by defining all sets of the chips 6 and the electronic component mounting portions 9a as the observation subjects. After the information (namely, provisional positioning positional information and relative positional relationship) has been prepared for all of these sets, which is required so as to calculate the alignment information as to the positioning operation when the mounting operation is carried out, the alignment information is calculated with respect to each of these chips to be mounted in order to execute the positioning operation, and then, the nozzle 33a is caused to descend so as to land the chip 6 on the electronic component mounting portion 9a.

As a consequence, every time the mounting operation with respect to one chip 6 is carried out, the observation head 34 is no longer advanced and evacuated between the mounting head 33 and the holding unit 10, so that the operation time can be shortened. Then, when the chip 6 is landed on the board 9, since the nozzle 33a is caused to descend under such a condition that the holding unit 10 has been caused to ascend up to the component mounting height, the time required for causing the nozzle 33a to descend in the mounting operation can be shortened, so that the entire operation time can be furthermore shortened. That is, in the above-explained electronic component mounting method corresponds to such a general-purpose mounting operation execution mode as the standard mode capable of mounting the electronic components on the board in a high efficiency.

Referring now to FIG. 16 to FIG. 22, a description is made of a processing function and an electronic component mounting operation of the electronic component mounting apparatus in the high precision mode. The electronic component mounting operation in the high precision mode contains: a step in which chips (electronic components) 6 are sucked/held by a plurality of nozzles (mounting nozzles) 33a of the mounting head 33; a provisional positioning step in which one chip 6 sucked/held by one nozzle among the plural nozzles 33a of the mounting head 33 is provisionally positioned above one of the electronic component mounting portions 9a; an observing step in which both an image of this provisionally positioned chip 6 and an image of the electronic component mounting portion 9a are acquired by the observation head 34 which is located in a space defined between this provisionally positioned chip 6 and the electronic component mounting portion 9a; a relative positional relationship detecting step in which a relative positional relationship between the chip 6 and the electronic component mounting portion 9a is detected based upon the image of the chip 6 and the image of the electronic component mounting portion 9a, which have been acquired in the observing step; an observation head evacuating step in which the observation head 34 is evacuated from the upper space of the board 9; an electronic component mounting step in which such a chip 6 which has been provisionally positioned by moving the mounting head 33 while reflecting the relative positional relationship detected in the above-described relative positional relationship detecting step is positioned with respect to the electronic component mounting portion 9a; a provisional positioning step in which all of the chips sucked/held by other nozzles 33a are provisionally positioned; and a step for sequentially executing the observing step, the relative positional relationship detecting step, the observation head evacuating step, and the electronic component mounting step.

A functional block diagram of the high precision mode shown in FIG. 16 is arranged by eliminating both the provisional positioning positional information storage part 53f and the relative positional relationship storage part 53g from the functional block diagram of the standard mode indicated in FIG. 10, namely, is formed by deleting such a function for storing both provisional positioning positional information and relative positional relationship information, which constitute a base capable of calculating alignment information. In this high precision mode, while two sets of the above-explained information are not once stored, alignment information is calculated. That is, as shown in FIG. 16, an alignment information calculating part 53h calculates such an alignment information based upon a relative positional relationship between a chip 6 and an electronic component mounting portion 9*a*, which is calculated by a relative positional information calculating process part 53*i*, and a present position (provisional positioning positional information) of the mounting head 33 transferred from a mounting head transport mechanism 59.

Next, the electronic component mounting operation in the high precision mode will now be described in accordance with a flow chart of FIG. 17 with reference to FIG. 18 to FIG. 22. In this mounting operation, similar to the above-described mounting operation, such an operation example is represented in the case that a mounting operation is continuously executed with respect to the board 9 on which the chips 6 have already been mounted.

Figure 17:
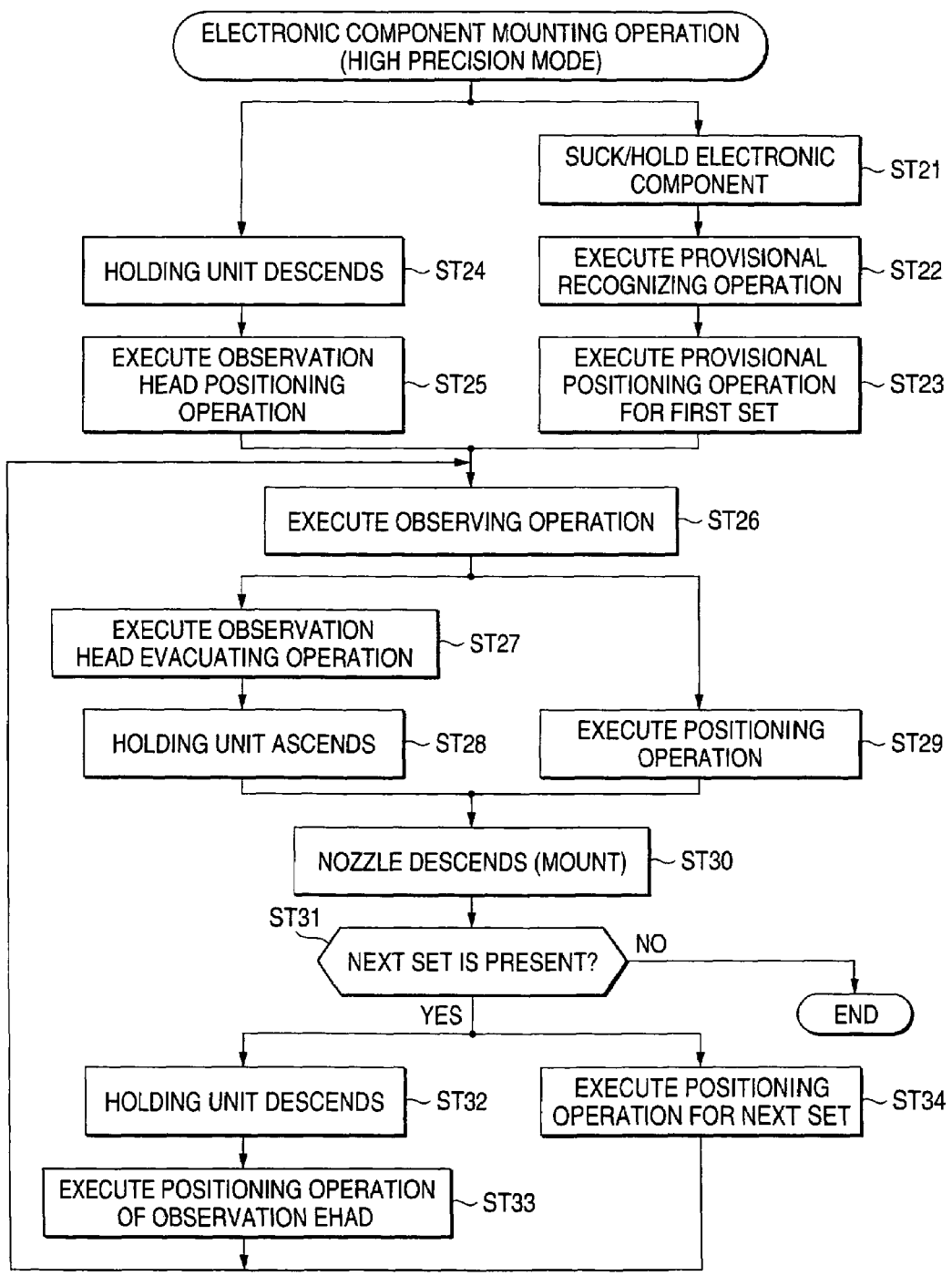
FIG. 17 is a flow chart for explaining an electronic component mounting method (high precision mode) of the embodiment 1 of the present invention.

In FIG. 17, since respective steps shown in (ST21) to (ST25) own the same contents as those of the steps (ST1) to (ST5) shown in FIG. 11, explanations thereof are omitted. Since these respective steps are completed, both the chips 6 and the electronic component mounting portions 9*a* are brought into observable conditions.

Thereafter, an observing operation is carried out (ST26), so that both an image of the provisionally positioned chip 6 and an image of the electronic component mounting portion 9*a* are acquired by the observation head 34 which is located in the space defined between this chip 6 and the electronic component mounting portion 9*a*. Similar to the embodiment 1, in this step, first of all, as represented in FIG. 18(*a*), both the image of the provisionally positioned chip 6 and the image of the electronic component mounting portion 9*a* are acquired by using the observation head 34.

Thereafter, a relative positional relationship as to both this chip 6 and the electronic component mounting portion 9*a* is detected based upon the image of the chip 6 and the image of the electronic component mounting portion 9*a*, which have been acquired in the observing step. In other words, based upon both the images of the chip 6 and the electronic component mounting portion 9*a*, a position of this chip 6 and a position of the electronic component mounting portion 9*a* are recognized by the electronic component recognizing unit 54 and the board recognizing unit 55, and then, a relative positional relationship between the chip 6 and the electronic component mounting portion 9*a* is calculated by the relative positional relationship calculating process part 53*i*. Then, the alignment information calculating part 53*h* calculates alignment information based upon the calculated relative positional relationship and the present position of the mounting head 33, which is transferred from the mounting head transport mechanism 59.

When the relative positional relationship has been detected as to one set, after the evacuating operation of the observation head 34 is carried out (ST27), ascending operation of the holding unit 10 is subsequently carried out (ST28). In other words, as shown in FIG. 18(*b*), the observation head 34 is evacuated from the upper space of the board 9. Next, as shown in FIG. 19(*a*), the holding unit 10 is caused to ascend up to a component mounting height. Then, in parallel to these operations, the first set of the chip 6 is positioned with respect to such an electronic component mounting portion 9*a* (namely, both right-sided chip 6 held by mounting head 33 and electronic component mounting portion 9*a* located adjacent to previously-mounted chip 6 (ST29).

Then, thereafter, as indicated in FIG. 19(*b*), the nozzle 33*a* which has held the first set of the above-explained chip 6 is caused to descend so as to mount the chip 6 on the electronic component mounting portion 9*a* of the board 9 (ST30). Next, a check is made as to whether or not there is a next set whose chip 6 will be mounted (ST31). In this case, in such a case that there is the next set, the mounting operation is returned to the operation for performing the observing operation by the observation head 34. That is to say, as shown in FIG. 20(*a*), the holding unit 10 is caused to descend up to a recognition height (ST32), and the observation head 34 is advanced to a space defined between the chip 6 and the board 9 so as to execute the positioning operation of the observation head 34 (ST33).

In parallel to these steps, a provisional positioning operation as to the next set is carried out (ST34). Then, the mounting operation is returned to the step (ST26), and as indicated in FIG. 20(*b*), both an image of the chip 6 and an image of the electronic component mounting portion 9*a* are acquired by the observation head 34. Then, similarly, a relative positional relationship is detected. Thereafter, as shown in FIG. 21(*a*), the observation head 34 is evacuated from the upper space of the holding unit 10. Next, as shown in FIG. 21(*b*), the holding unit 10 is caused to ascend up to the component mounting height, and then, the chip 6 of the next set is positioned to the electronic component mounting portion 9*a* (namely, left-sided chip 6 held by mounting head 33, and electronic component mounting portion 9*a* located adjacent to chip 6 which has been mounted in preceding mounting operation).

Figure 22:
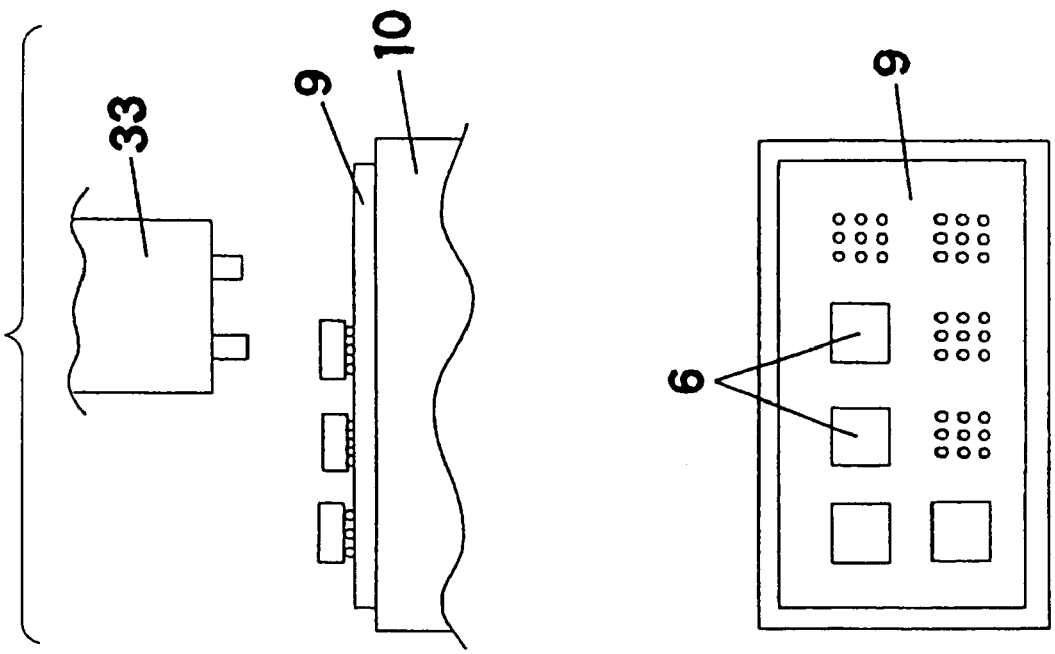
FIGS. 22(a) and 22(b) are step explanatory diagrams for explaining the electronic component mounting method (high precision mode) of the embodiment 1 of the present invention.
Figure 22:
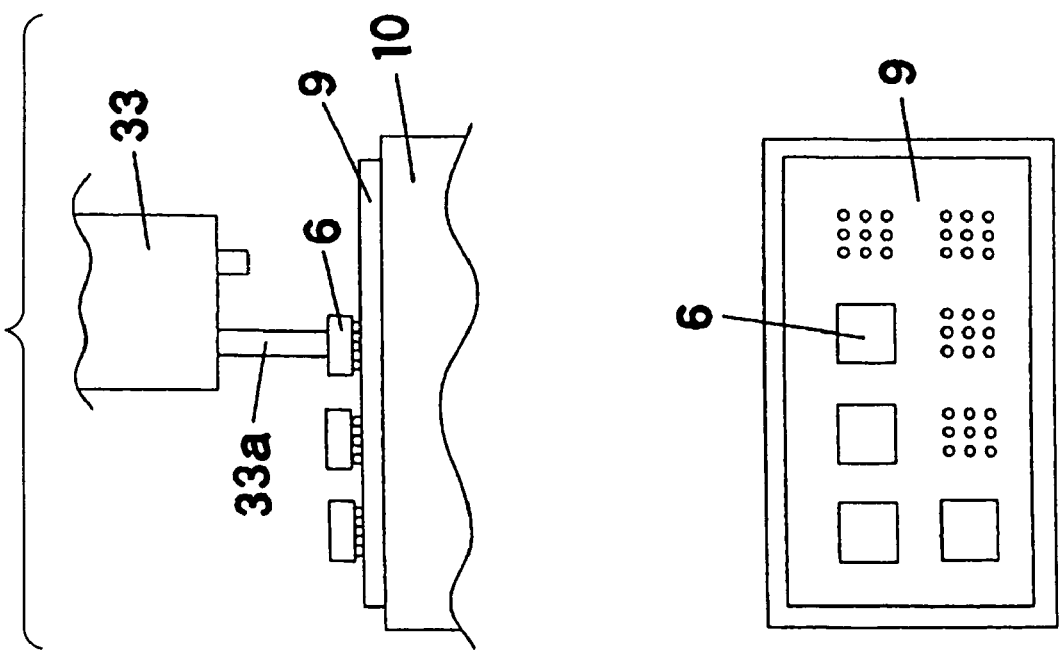

Thereafter, as shown in FIG. 22(*a*), the nozzle 33*a* is caused to descend so as to mount the chip 6 on the electronic component mounting portion 9*a* of the board 9 (ST30). Then, these steps are repeatedly carried out. If such a judgement is made that there is no next set whose chip 6 will be mounted in the step (ST31), then the electronic component mounting operation is accomplished.

As previously explained, in accordance with the electronic component mounting method in the high precision mode, while the chips 6 are mounted on the board 9 by the mounting head 33 equipped with a plurality of nozzles 33*a*, one set of the chip 6 and the electronic component mounting portion 9*a* are observed as the observation set. If the alignment information used to position these chip 6 and electronic component mounting portion 9*a* is obtained based upon the observation result, then the electronic component mounting operation by the mounting head 33 may be immediately carried out based upon this alignment information.

As a result, when the mounting head 33 is positioned based upon the alignment information, such a positioning error can be eliminated which is caused by the mechanism errors of the respective shafts employed in the mounting head transport mechanism 59 which transports the mounting head 33, so that high mounting position precision may be realized. That is, the above-described mounting method implies such a mounting operation execution mode in the high precision mode, which owns such a purpose that the high-precision component which requires the high packaging precision may be mounted on the board in better positional precision.

Figure 23:
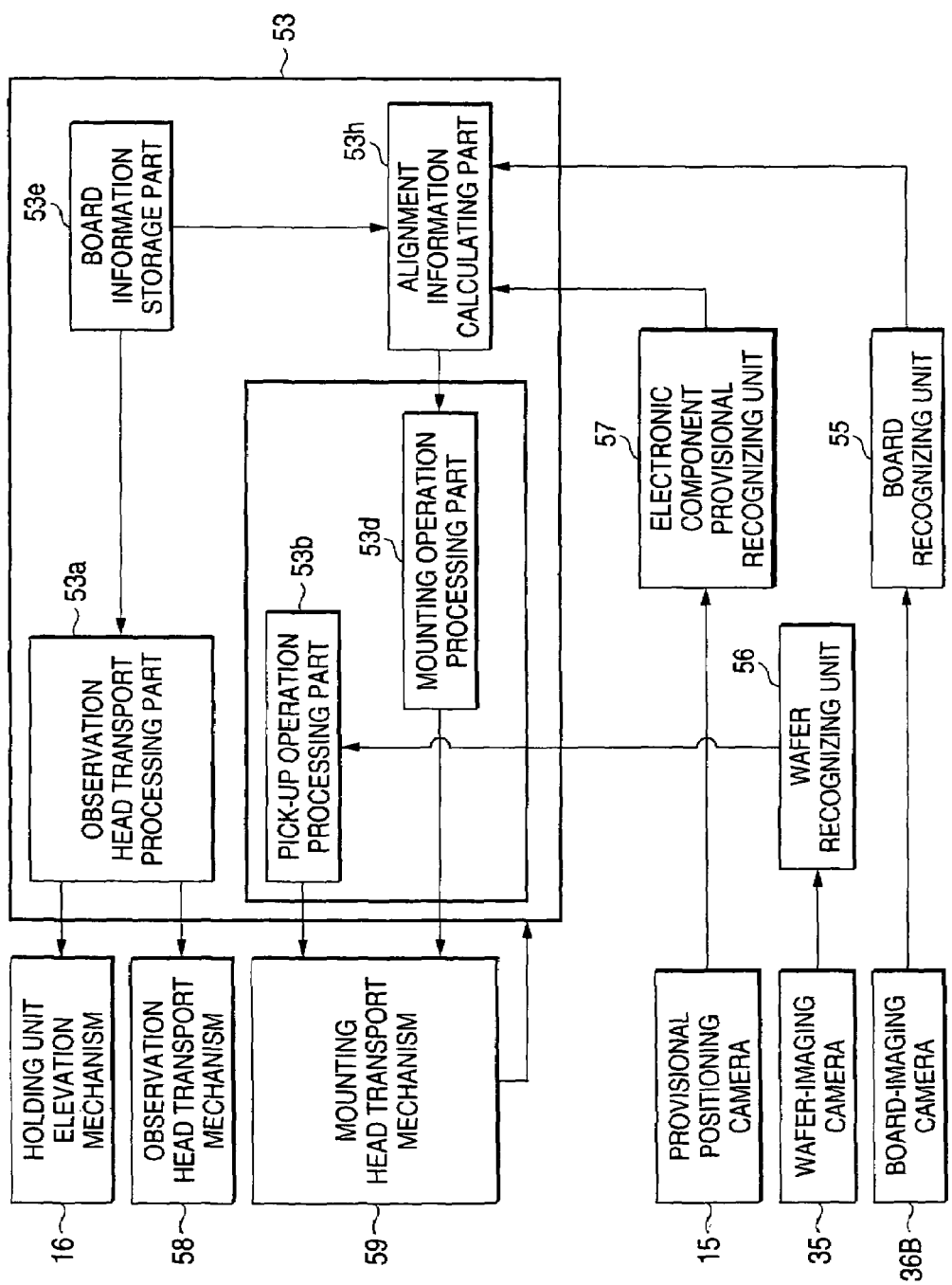
FIG. 23 is a functional block diagram for indicating processing functions in the case that the electronic component mounting apparatus according to the embodiment 1 of the present invention is operated in a high speed mode.
Figure 24:
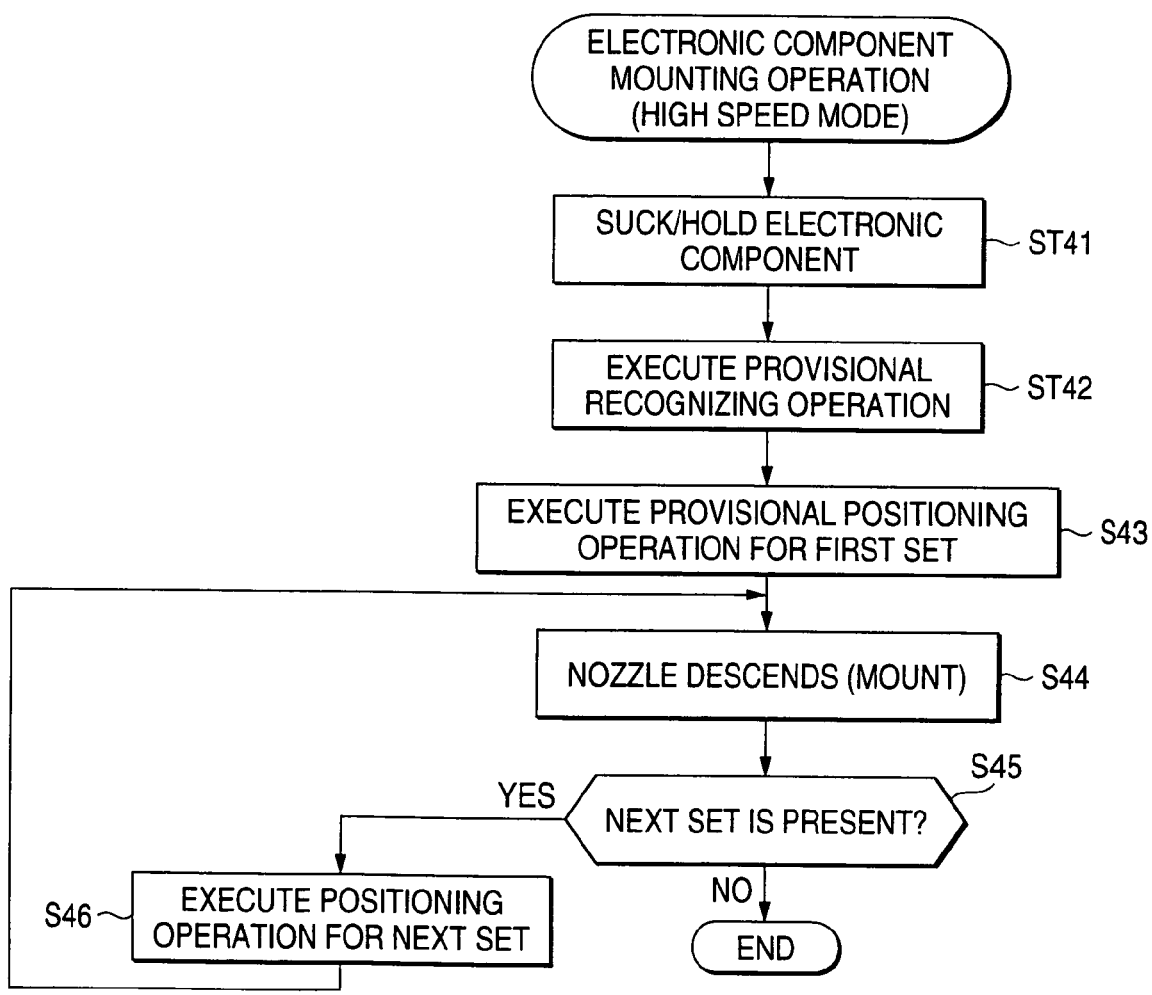
FIG. 24 is a flow chart for explaining an electronic component mounting method (high speed mode) of the embodiment 1 of the present invention.

FIG. 23 is a functional block diagram for representing process functions in such a case of a high speed mode of the electronic component mounting apparatus according to the embodiment 1 of the present invention. FIG. 24 is a flowchart for explaining an electronic component mounting method (high speed mode) of the embodiment 1 of the present invention.

The functional block diagram shown in FIG. 23 is arranged by eliminating the provisional positioning positional information storage part 53*f*, the relative positional relationship storage part 53*g*, the relative positional relationship calculating process part 53*i*, the provisional positioning operation processing part 53*c*, the electronic component-imaging camera 36A, and also, the electronic component recognizing unit 54 from the functional block diagram of the standard mode shown in FIG. 10. This functional block diagram of FIG. 23 is formed by that a method of calculating alignment information is simplified.

As shown in FIG. 23, an alignment information calculating part 53*h* calculates alignment information based upon both a position recognition result of a chip 6 and a position recognition result of a board 9. This position recognition result of the chip 6 is obtained by that an image of this chip 6 acquired by the provisional positioning camera 15 is recognized by the electronic component provisional recognizing unit 57. The position recognition result of the board 9 is obtained by that an image of this board 9 acquired by the board-imaging camera 36B is recognized by the board recognizing unit 55. The position recognizing operation of the board 9 is carried out based upon a position of a feature portion such as a recognition mark formed on the board 9.

In other words, positions of the respective electronic component mounting portions 9*a* are specified based upon array information of the electronic component mounting portion 9*a* contained in the board information which has been stored in the board information storage part 53*e*, and also, a positional shift of the board 9 obtained by the board recognizing operation. Then, a final target position of the mounting head 33 is calculated based upon both the position of this electronic component mounting portion 9*a* and a positional shift amount of the chip 6 obtained from the recognition result of the chip 6.

Next, electronic component mounting operation in the high speed mode will now be described with reference to a flow chart of FIG. 24. This electronic component mounting operation corresponds to such a high speed mode of mounting operation which is executed by employing this electronic component mounting apparatus. Prior to a commencement of the mounting operation, the board 9 held by the holding unit 10 is recognized by the board-imaging camera 36B, and thus, a positional shift of the board 9 is detected. Then, in FIG. 24, an electronic component sucking/holding operation is firstly carried out (ST41).

That is to say, the chips 6 are sucked/held from the stage 79 by a plurality of nozzles 33*a* of the mounting head 33. Then, while the mounting head 33 which has held a chip 6 passes through an upper space of the provisional positioning camera 15, a provisional recognizing operation of this chip 6 is carried out (ST42) As a result, the chip 6 under the holding condition by the mounting head 33 is photographed and then a position of this photographed chip 6 is recognized. Then, based upon this provisional recognizing result, a provisional positioning operation as to a first set is carried out (ST43).

Thereafter, the present provisional positioning operation is advanced to amounting operation. In this case, the nozzle 33*a* which holds the first chip 6 set under the provisional positioning condition is caused to descend so as to mount the chip 6 on the electronic component mounting portion 9*a* of the board 9. Next, a check is made as to whether or not there is a next set whose chip 6 will be mounted. When there is the next set, a provisional positioning operation is carried out with respect to the next set (ST46). Then, the mounting operation is returned to the previous step (ST44). In this step, such a mounting operation is similarly carried out in which the nozzle 33*a* is caused to descend. Then, these steps are repeatedly carried out. When it is so judged at the step (ST45) that no set is present whose chip 6 will be mounted, the electronic component mounting operation is accomplished.

As previously explained, the electronic component mounting method in the high speed mode is realized by sequentially executing the below-mentioned mounting operations. That is, when the chips 6 are mounted on the board 9 by using the mounting head 33 equipped with a plurality of nozzles 33*a*, the alignment information is calculated based upon both the position of the chip 6 which is detected by acquiring the image of this chip 6 by the provisional positioning camera 15 and the position of the electronic component mounting portion 9*a*. The position of the chip 6 is detected by the provisional positioning camera 15 in the path through which the mounting head 33 holding the chip 6 is transported from the component supply unit 2 to the holding unit 10. The position of the electronic component mounting portion 9*a* is detected by considering the board recognition result with respect to the previously stored array information of the electronic component mounting portion 9*a*.

As a result, the electronic component mounting operation can be carried out while the observing operation required for the positioning operation is not carried out every set of the chip 6 and the electronic component mounting portion 9*a*. In other words, the above-described electronic component mounting method corresponds to such a high-speed mounting mode that such an electronic component to which high mounting positional precision is not required can be mounted in the high speed within a short tack time.

As previously explained, the electronic component mounting apparatus shown in the embodiment 1 is capable of selecting the high precision mode and the high speed mode in response to the mounting precision which is required for the electronic component to be mounted except for the mounting execution mode of the general-purpose standard mode by which the superior mounting positional precision is compatible with the high-efficiency component mounting work.

In other words, the mounting execution mode of the high precision mode designed for the high precision component which requires the high packaging precision, and furthermore, the high-speed mounting mode in which the electronic component which does not require the high mounting positional precision can be mounted in the high speed within a short tact time.

(Embodiment 2)

Next, a description is made of an electronic component mounting apparatus according to an embodiment 2 of the present invention. As to the electronic component mounting apparatus of the embodiment 2, only a processing mechanism operated in a standard mode is different from that of the embodiment 1, and other arrangements and processing functions in both a high precision mode and a high speed mode are identical to those of the embodiment 1. Accordingly, the explanation as to the electronic component mounting apparatus according to the embodiment mode 2 is limited to a processing function executed in the standard mode.

Figure 25:
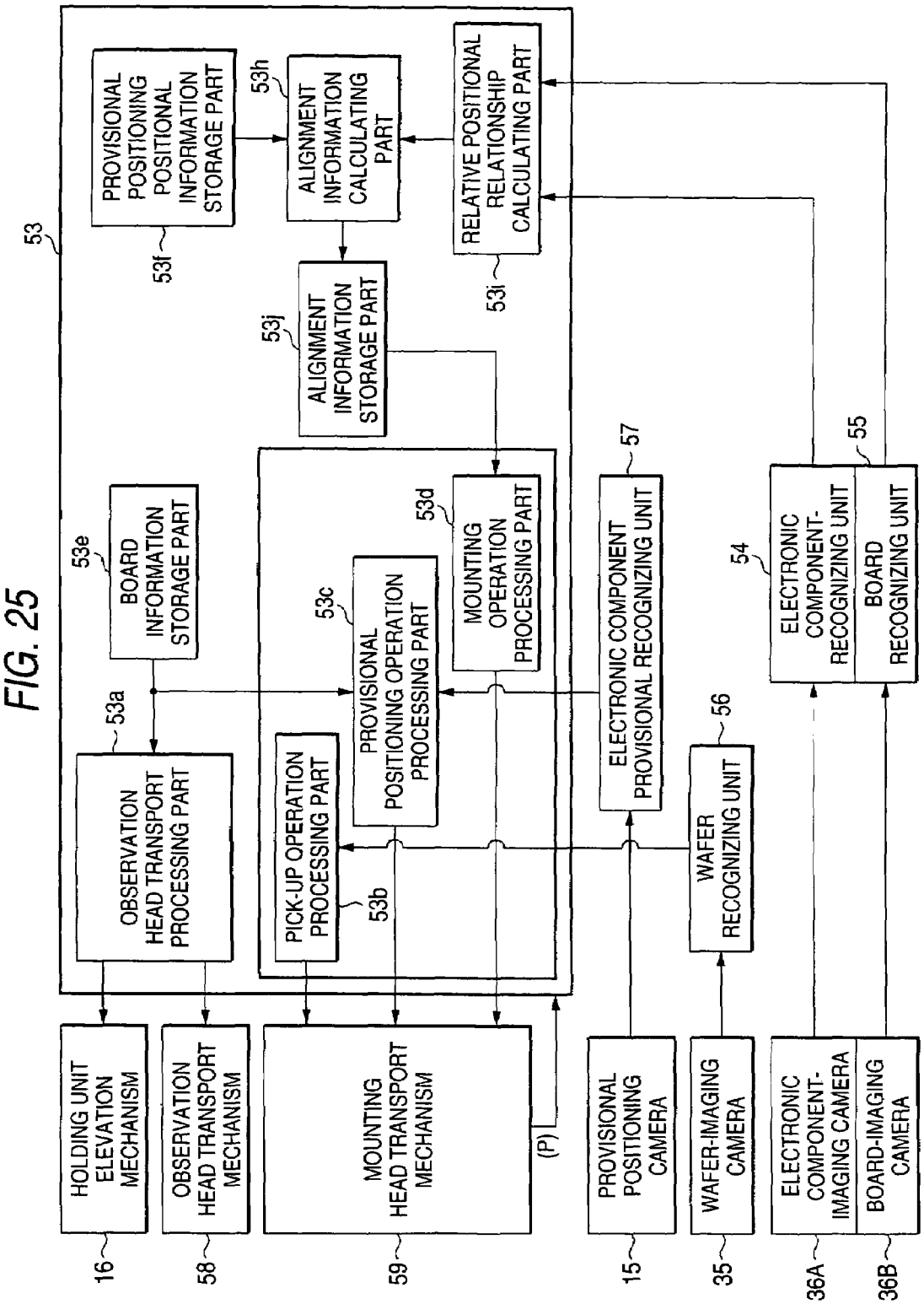
FIG. 25 is a functional block diagram for indicating processing functions in the case that the electronic component mounting apparatus according to the embodiment 2 of the present invention is operated in a standard mode.

FIG. 25 is a functional block diagram for indicating the processing function in the case that the electronic component mounting apparatus according to the embodiment 2 of the present invention is operated in the standard mode. In the embodiment 1 (see FIG. 10), both the provisional positioning positional information of the mounting head 33 and the information indicative of the relative positional relationship between the chip 6 and the electronic component mounting portion 9a are stored every set of the chip 6 and the electronic component unit 9a. In the embodiment 2, alignment information is stored every set of the chip 6 and the electronic component unit 9a.

In other words, as shown in FIG. 25, relative positional relationship calculated by the relative positional relationship calculating process part 53i is not once stored, but is directly transferred to the alignment information calculating part 53h. The alignment information calculating part 53h calculates alignment information based upon both a position of the mounting head when a provisional positioning operation is performed, which has been stored in the provisional positioning positional information storage part 53f, and the relative positional relationship calculated by the relative positional relationship calculating process part 53i (alignment information calculating step).

The alignment information storage part 53j stores thereinto the alignment information calculated by the alignment information calculating part 53h every set of the chip 6 and the electronic component mounting portion 9a (storage step). When a mounting operation is controlled by the mounting operation processing part 53d, the mounting head transport mechanism 59 is controlled based upon the alignment information stored in the alignment information storage part 53j. Similar to the embodiment 1, also in this embodiment 2, since the mounting operation is carried out after the observing operations used to calculate the alignment information have been previously carried out as to all of the sets, a similar effect may be achieved.

As previously described, in the electronic component mounting method (standard mode) according to the embodiment 2 of the present invention, in such an electronic component mounting operation that the chips 6 are sucked/held by the respective plurality nozzles 33a provided on the mounting head 33 and are mounted on the electronic component mounting portions 9a of the board 9, such a relative position detecting operation is carried out with respect to all of the chips 6 which have been sucked/held by the nozzles 33a. In this relative position detecting operation, both the provisionally positioned chip 6 and the electronic component mounting portion 9a are observed by the observation head 34 which is located in the space defined between this chip 6 and the electronic component mounting portion 9a. Then, the mounting operation for positioning the chip 6 with respect to the electronic component mounting portion 9a by reflecting the calculated relative positional relationship so as to mount this positioned chip 6 thereon is sequentially carried out with respect to all of the chips 6.

As a result, the tact time per one electronic component can be largely shortened, as compared with the conventional method in which the observation camera is advanced/evacuated between the mounting head and the board every time one electronic component is mounted. Furthermore, while the holding unit for holding the board is arranged in such a way that this holding unit can be elevated, since the interval between the board and the mounting head is made narrow when the mounting operation is carried out, the time required for elevating the nozzles can be shortened, so that the tact time can be furthermore shortened, and also, the superior mounting position precision can be compatible with the high-efficiency component mounting work.

In accordance with the present invention, in such an electronic component mounting operation that the electronic components are sucked/held by the respective plurality nozzles provided on the mounting head and are mounted on the electronic component mounting portions of the board 9, such a relative position detecting operation is carried out with respect to all of the electronic components which have been sucked/held by the nozzles, while in this relative position detecting operation, both the provisionally positioned electronic component and the electronic component mounting portion are observed by the observation head which is located in the space defined between this electronic component and the electronic component mounting portion. Then, the mounting operation for positioning the electronic component with respect to the electronic component mounting portion by reflecting the calculated relative positional relationship so as to mount this positioned electronic component thereon is sequentially carried out with respect to all of the electronic components. As a consequence, the better mounting positional precision can be compatible with the high-efficiency component mounting work.

What is claimed:

1. An electronic component mounting method in which an electronic component is sucked and held by each of a plurality of mounting nozzles provided in a mounting head so as to be mounted on an electronic component mounting portion of a board, comprising:

a component holding step for sucking and holding electronic components by said plurality of mounting nozzles of said mounting head;

a provisional positioning step for provisionally positioning the electronic component sucked and held by one of said plural mounting nozzles above one electronic component mounting portion;

an observing step in which both an image of the provisionally positioned electronic component and an image of the electronic component mounting portion are acquired by an observation head located in a space defined between said provisionally positioned electronic component and the electronic component mounting portion;

a relative positional relationship detecting step for detecting a relative positional relationship between said provisionally positioned electronic component and said electronic component mounting portion based upon said images of both said electronic component and said electronic component mounting portion, which are acquired in said observing step;

a step for sequentially executing said provisional positioning step, said observing step, and said relative positional relationship detecting step as to all of the electronic components sucked and held by other mounting nozzles;

an observation head evacuating step for evacuating said observation head from an upper space of the board;

and a step in which such a mounting operation that the electronic components sucked and held by said plurality of mounting nozzles are positioned so as to be mounted on the electronic component mounting portions by transporting said mounting head while reflecting thereto the relative positional relationship detected in said relative positional relationship detecting step is carried out with respect to all of the electronic components.

2. An electronic component mounting method as claimed in claim 1, wherein after said observation head evacuating step, an interval changing step for narrowing an interval between said board and said mounting nozzles is executed; and thereafter, said mounting operation is carried out while said mounting nozzles are elevated.

3. An electronic component mounting method as claimed in claim 2, wherein said interval changing step causes the board to ascend with respect to said mounting head.

4. An electronic component mounting method as claimed in claim 1, wherein the electronic component corresponds to such an electronic component in which a plurality of bumps have been formed on a surface thereof; and said bumps are mounted on electrodes of the electronic component mounting portions of said board.

5. An electronic component mounting method as claimed in claim 4, further comprising:
a step for reversing the electronic component supplied in such a manner that the plane of said electronic component where the bumps have been formed is directed to an upper direction, and for supplying the reversed electronic component to said mounting head.

6. An electronic component mounting method as claimed in claim 4, further comprising: an electronic component transporting step for transporting the electronic component supplied in such a manner that the plane of said electronic component where the bumps have been formed is directed to the upper direction to up-down reversing means by an electronic component transport mechanism; an up-down reversing step for turning the electronic component upside down by the up-down reversing means; and a step for picking up the up-down reversed electronic component by said mounting head.

7. An electronic component mounting method as claimed in claim 4, further comprising:
an electronic component transporting step for transporting the electronic component supplied in such a manner that the plane of said electronic component where the bumps have been formed is directed to the upper direction to up-down reversing means by said mounting head;
an up-down reversing step for turning the electronic component upside down by the up-down reversing means;
and a step for picking up the up-down reversed electronic component by said mounting head.

8. An electronic component mounting method in which an electronic component is sucked/held by each of a plurality of mounting nozzles provided in a mounting head so as to be mounted on an electronic component mounting portion of aboard, comprising:
a component holding step for sucking and holding electronic components by said plurality of mounting nozzles of said mounting head;
a provisional positioning step for provisionally positioning the electronic component sucked and held by one of said plural mounting nozzles above one electronic component mounting portion;
an observing step in which one set of both an image of the provisionally positioned electronic component and an image of the electronic component mounting portion are acquired by an observation head located in a space defined between said provisionally positioned electronic component and the electronic component mounting portion;
a relative positional relationship detecting step for detecting a relative positional relationship between said provisionally positioned electronic component and said electronic component mounting portion based upon said images of both said electronic component and said electronic component mounting portion, which are acquired in said observing step;
a storage step for storing thereinto said relative positional relationship and provisional positioning positional information corresponding to positional information of said provisionally positioned mounting head;
a step in which since said provisional positioning step, said observing step, said relative positional relationship detecting step, and said storage step are sequentially executed every a set of both all of said electronic components sucked and held by other mounting nozzles and the electronic component mounting portions on which said electronic components are mounted, both the provisional positioning positional information and the relative positional relationship are stored every said set;
an observation head evacuating step for evacuating said observation head from an upper space of the board;
and a step in which alignment information is calculated every said set based upon said stored provisional positioning positional information and said stored relative positional information, and then, such a mounting operation is executed every said set, in which the electronic components are positioned so as to be mounted with respect to the electronic component mounting portions by transporting said mounting head based upon said alignment information.

9. An electronic component mounting method as claimed in claim 8, wherein after said observation head evacuating step, an interval changing step for narrowing an interval between said board and said mounting nozzles is executed; and thereafter, said mounting operation is carried out while said mounting nozzles are elevated.

10. An electronic component mounting method as claimed in claim 9, wherein said interval changing step causes the board to ascend with respect to said mounting head.

11. An electronic component mounting method as claimed in claim 8, wherein the electronic component corresponds to such an electronic component in which a plurality of bumps have been formed on a surface thereof; and said bumps are mounted on electrodes of the electronic component mounting portions of said board.

12. An electronic component mounting method as claimed in claim 11, further comprising:
a step for reversing the electronic component supplied in such a manner that the plane of said electronic component where the bumps have been formed is directed to an upper direction, and for supplying the reversed electronic component to said mounting head.

13. An electronic component mounting method as claimed in claim 11, further comprising:
an electronic component transporting step for transporting the electronic component supplied in such a manner that the plane of said electronic component where the bumps have been formed is directed to the upper direction to up-down reversing means by an electronic component transport mechanism;
an up-down reversing step for turning the electronic component upside down by the up-down reversing means;
and a step for picking up the up-down reversed electronic component by said mounting head.

14. An electronic component mounting method as claimed in claim 11, further comprising:
an electronic component transporting step for transporting the electronic component supplied in such a manner that the plane of said electronic component where the bumps have been formed is directed to the upper direction to up-down reversing means by said mounting head;

an up-down reversing step for turning the electronic component upside down by the up-down reversing means;

and a step for picking up the up-down reversed electronic component by said mounting head.

15. An electronic component mounting method in which an electronic component is sucked and held by each of a plurality of mounting nozzles provided in a mounting head so as to be mounted on an electronic component mounting portion of a board, comprising:

a component holding step for sucking and holding electronic components by said plurality of mounting nozzles of said mounting head;

a provisional positioning step for provisionally positioning the electronic component sucked and held by one of said plural mounting nozzles above one electronic component mounting portion;

an observing step in which one set of both an image of the provisionally positioned electronic component and an image of the electronic component mounting portion are acquired by an observation head located in a space defined between said provisionally positioned electronic component and the electronic component mounting portion;

a relative positional relationship detecting step for detecting a relative positional relationship between said provisionally positioned electronic component and said electronic component mounting portion based upon said images of both said electronic component and said electronic component mounting portion, which are acquired in said observing step;

an alignment information calculating step for calculating alignment information based upon both said relative positional relationship and provisional positioning positional information corresponding to positional information of said provisionally positioned mounting head;

a storage step for storing thereinto said calculated alignment information;

a step in which since said provisional positioning step, said observing step, said relative positional relationship detecting step, said alignment information calculating step, and said storage step are sequentially executed every a set of both all of said electronic components sucked and held by other mounting nozzles and the electronic component mounting portions on which said electronic components are mounted, alignment information is stored every said set;

an observation head evacuating step for evacuating said observation head from an upper space of the board;

and a step in which such a mounting operation is executed every said set, in which the electronic components are positioned so as to be mounted with respect to the electronic component mounting portions by transporting said mounting head based upon said stored alignment information.

16. An electronic component mounting method as claimed in claim 15, wherein after said observation head evacuating step, an interval changing step for narrowing an interval between said board and said mounting nozzles is executed; and thereafter, said mounting operation is carried out while said mounting nozzles are elevated.

17. An electronic component mounting method as claimed in claim 16, wherein said interval changing step causes the board to ascend with respect to said mounting head.

18. An electronic component mounting method as claimed in claim 15, wherein the electronic component corresponds to such an electronic component in which a plurality of bumps have been formed on a surface thereof; and said bumps are mounted on electrodes of the electronic component mounting portions of said board.

19. An electronic component mounting method as claimed in claim 18, further comprising:

a step for reversing the electronic component supplied in such a manner that the plane of said electronic component where the bumps have been formed is directed to an upper direction, and for supplying the reversed electronic component to said mounting head.

20. An electronic component mounting method as claimed in claim 18, further comprising:

an electronic component transporting step for transporting the electronic component supplied in such a manner that the plane of said electronic component where the bumps have been formed is directed to the upper direction to up-down reversing means by an electronic component transport mechanism;

an up-down reversing step for turning the electronic component upside down by the up-down reversing means; and a step for picking up the up-down reversed electronic component by said mounting head.

21. An electronic component mounting method as claimed in claim 18, further comprising:

an electronic component transporting step for transporting the electronic component supplied in such a manner that the plane of said electronic component where the bumps have been formed is directed to the upper direction to up-down reversing means by said mounting head;

an up-down reversing step for turning the electronic component upside down by the up-down reversing means;

and a step for picking up the up-down reversed electronic component by said mounting head.

* * * * *